(12) United States Patent
Yamamiya

(10) Patent No.: US 8,168,338 B2
(45) Date of Patent: May 1, 2012

(54) MOBILE TERMINAL EQUIPMENT USING FUEL BATTERY AND FUEL BATTERY SYSTEM FOR MOBILE TERMINAL EQUIPMENT

(75) Inventor: Kunio Yamamiya, Hachioji (JP)

(73) Assignee: Olympus Imaging Corp., Tokyo (JP)

( * ) Notice: Subject to any disclaimer, the term of this patent is extended or adjusted under 35 U.S.C. 154(b) by 1108 days.

(21) Appl. No.: 11/825,962

(22) Filed: Jul. 9, 2007

(65) Prior Publication Data

US 2008/0014482 A1 Jan. 17, 2008

(30) Foreign Application Priority Data

Jul. 13, 2006 (JP) ................................. 2006-193067
Jun. 29, 2007 (JP) ................................. 2007-172135

(51) Int. Cl.
*H01M 8/22* (2006.01)
*H04N 5/225* (2006.01)

(52) U.S. Cl. .................................. 429/403; 348/207.99

(58) Field of Classification Search .................. 429/400, 429/403, 433, 444; 348/207.99, 374, 375
See application file for complete search history.

(56) References Cited

U.S. PATENT DOCUMENTS

| 5,976,725 A * | 11/1999 | Gamo et al. ................. 429/421 |
| 6,766,817 B2 | 7/2004 | da Silva |
| 7,442,451 B2 * | 10/2008 | Sugihara ....................... 429/428 |
| 2004/0142222 A1 | 7/2004 | Yang et al. |
| 2005/0280987 A1 * | 12/2005 | Kwitek et al. ................ 361/687 |
| 2006/0243025 A1 | 11/2006 | Cheng et al. |
| 2007/0031709 A1 | 2/2007 | Hosoe |

FOREIGN PATENT DOCUMENTS

| JP | 06-33787 | 2/1994 |
| JP | 06-066787 A | 3/1994 |
| JP | 2002-216782 | 8/2002 |
| JP | 2003-210395 | 7/2003 |
| JP | 2003333100 A | 11/2003 |
| JP | 2004-241261 | 8/2004 |
| JP | 2004-362786 | 12/2004 |
| JP | 2005-174774 | 6/2005 |
| JP | 2006-24028 | 1/2006 |

(Continued)

OTHER PUBLICATIONS

"Fuel Control Micro-Valve for Portable Fuel Cells," Matsushita Technical Journal, vol. 53, No. 4, 2005.

*Primary Examiner* — Ula C. Ruddock
*Assistant Examiner* — Thomas H. Parsons
(74) *Attorney, Agent, or Firm* — Volpe and Koenig, P.C.

(57) ABSTRACT

Mobile terminal equipment is provided with a battery receiving chamber for using a fuel battery cell unit including a hydrogen storage alloy container, a pressure adjusting valve, and a fuel battery cell. A fuel battery system for mobile terminal equipment is further provided with a fuel battery including the valve, and a secondary battery. A space section between an inner surface of the battery receiving chamber and the fuel battery cell unit is formed by contact between protrusion sections provided on the fuel battery cell unit and the inner surface of the battery receiving chamber. In an electronic camera main body, an air intake port provided near a grip is disposed near an anode side of a fuel battery cell, a part of the air intake port and a fuel tank can be attached or detached from the electronic camera main body.

11 Claims, 16 Drawing Sheets

FOREIGN PATENT DOCUMENTS

| | | | |
|---|---|---|---|
| JP | 2006-091399 | * | 4/2006 |
| JP | 2006-099984 | | 4/2006 |
| JP | 2006-164872 | | 6/2006 |
| JP | 2006-203997 | | 8/2006 |
| JP | 2006-208832 | | 8/2006 |
| JP | 2006-353094 | | 12/2006 |

* cited by examiner

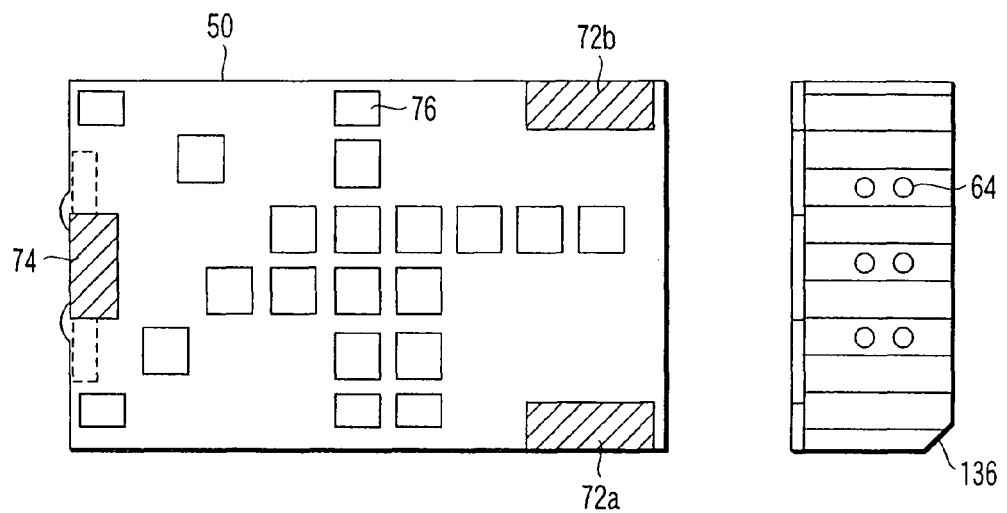
F I G. 4A  F I G. 4B
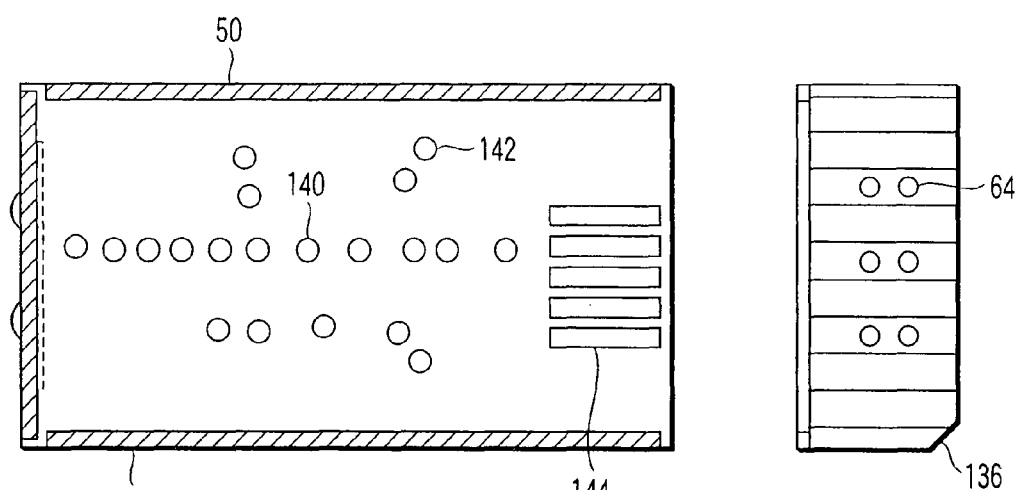
F I G. 5A  F I G. 5B

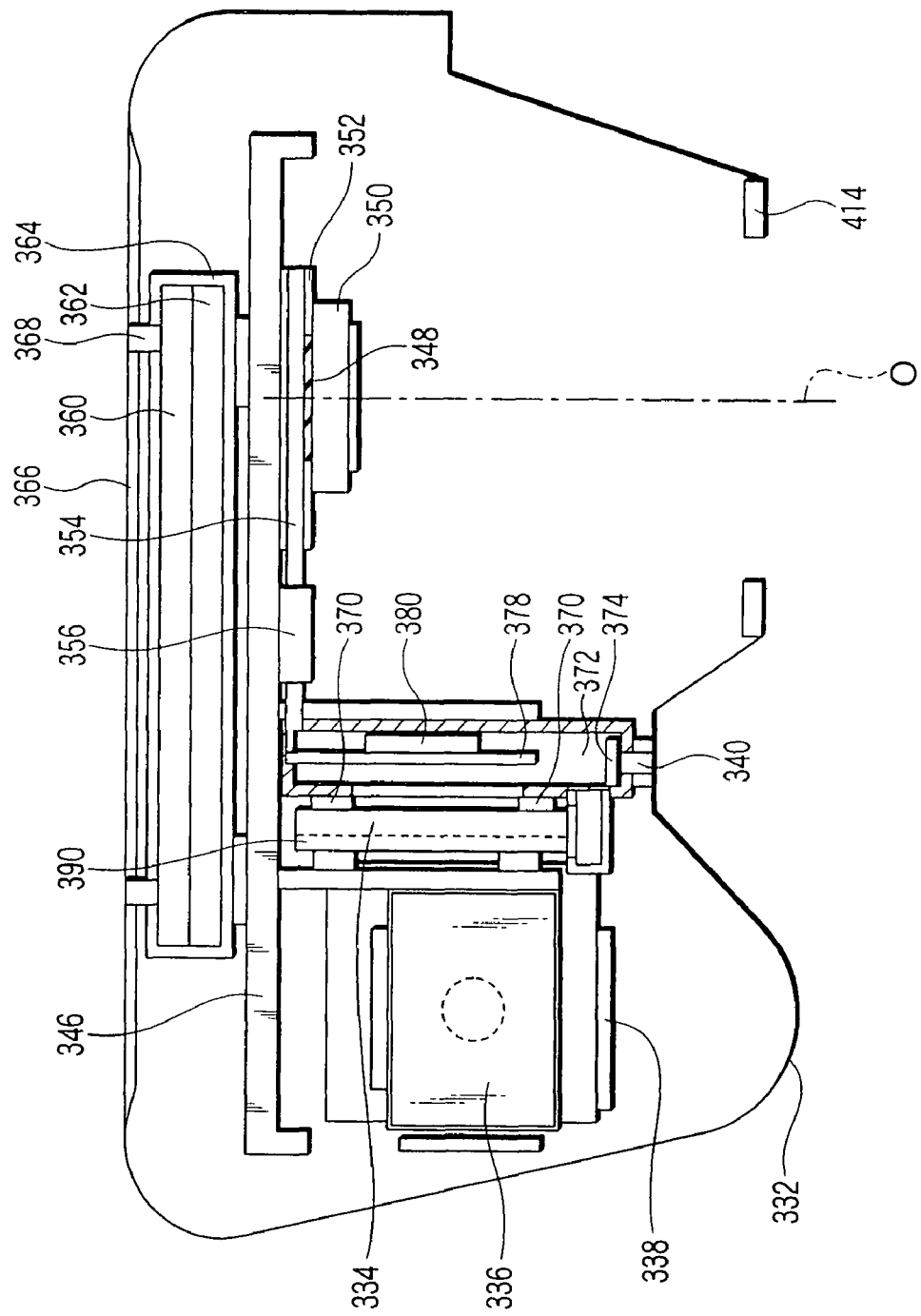
F I G. 14B

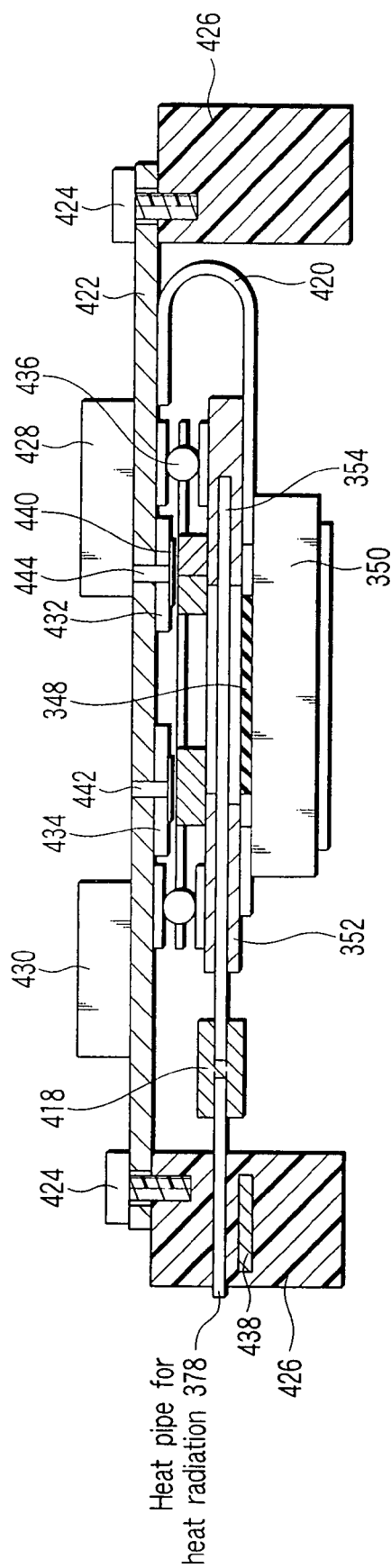
F I G. 15A
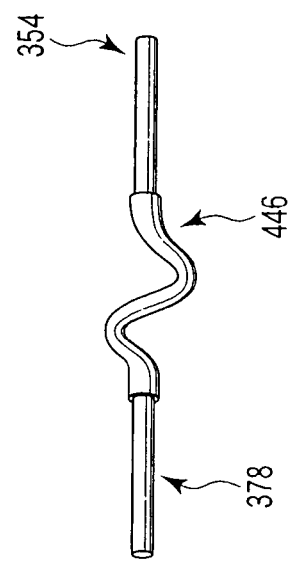
F I G. 15B

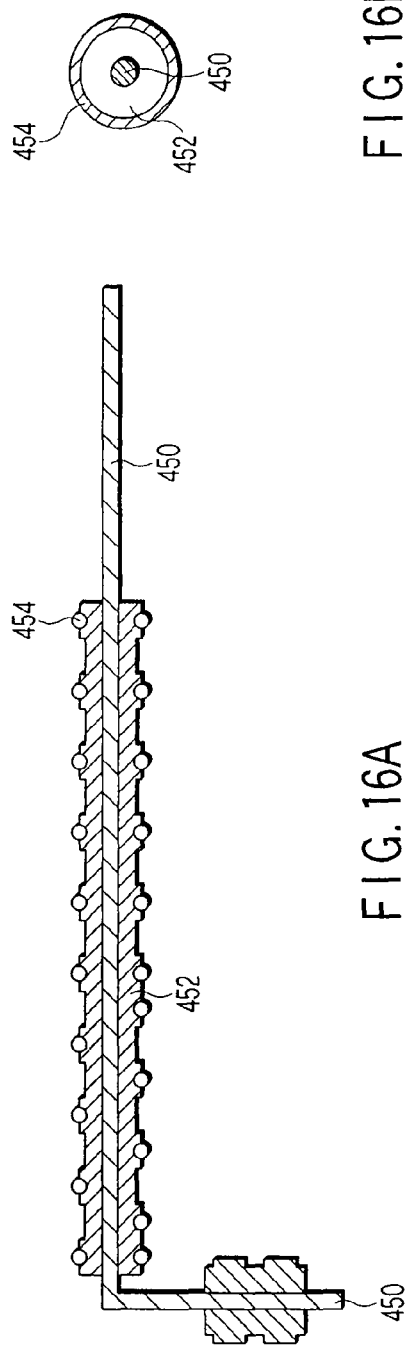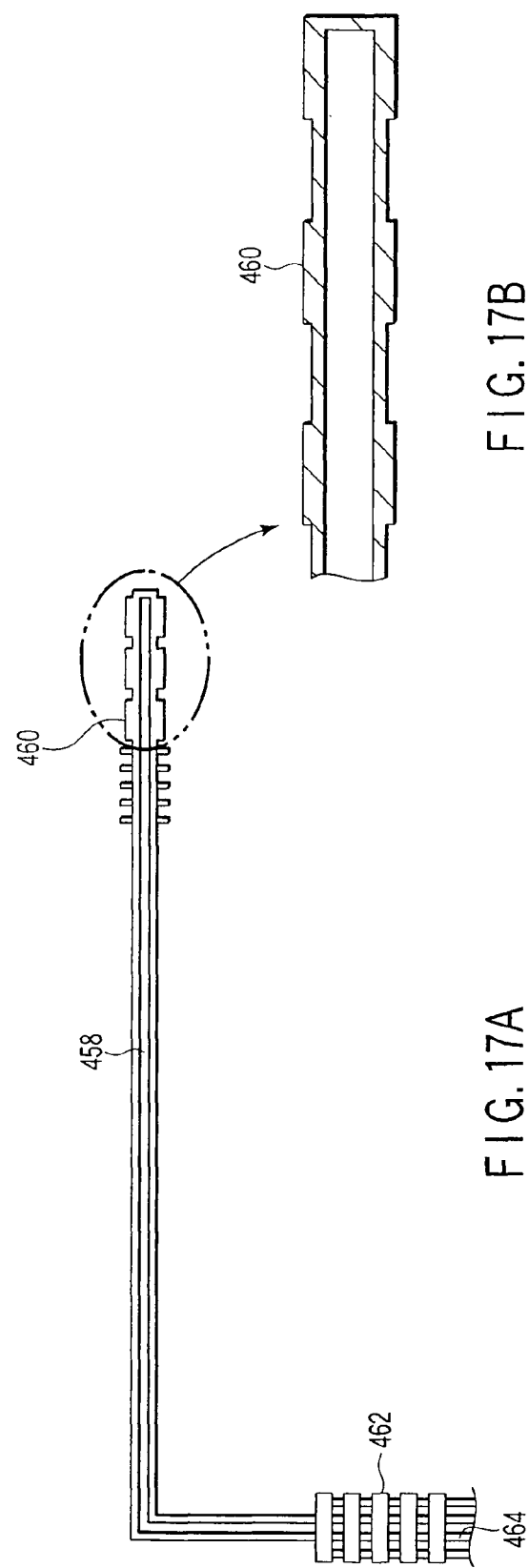

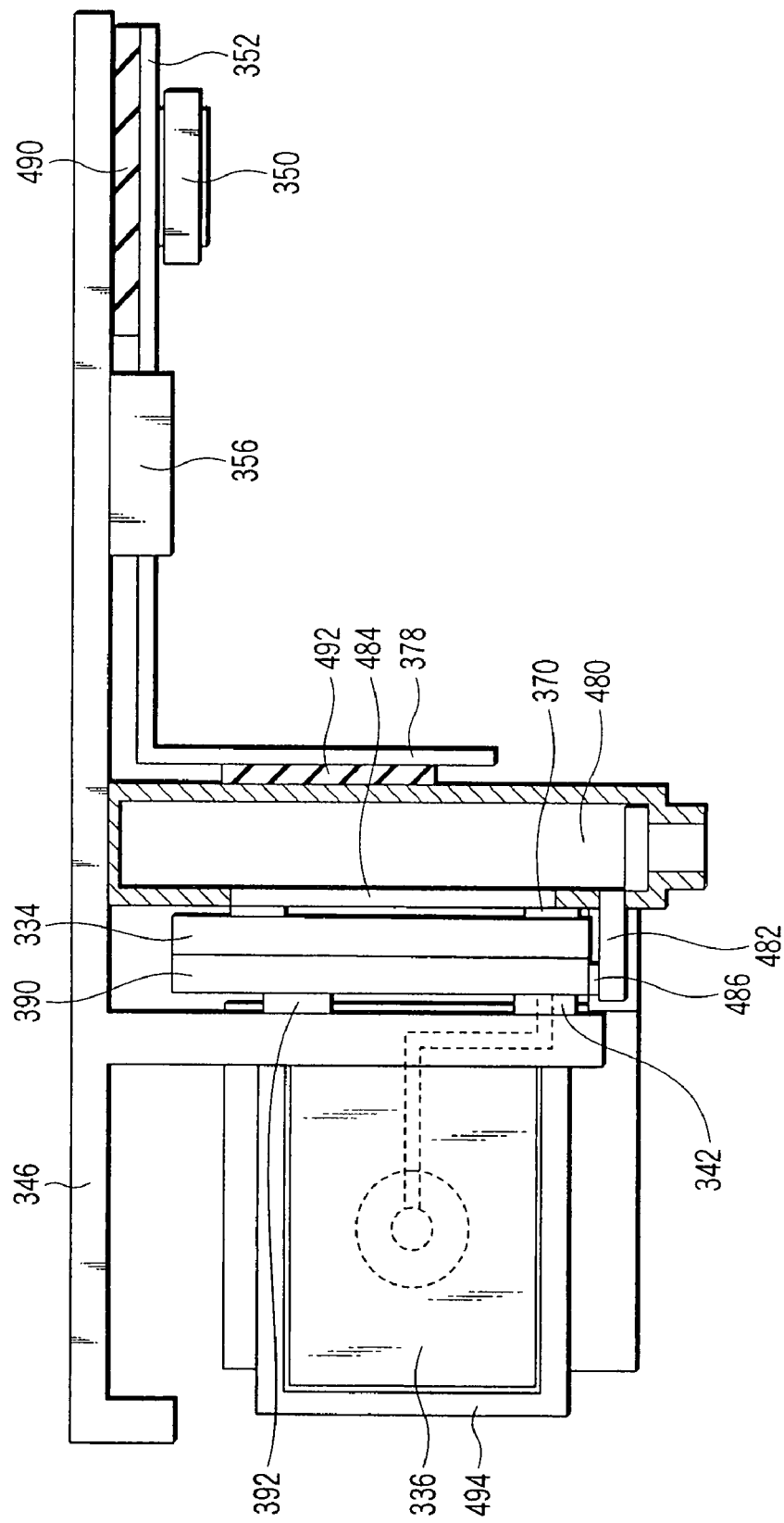
F I G. 19

MOBILE TERMINAL EQUIPMENT USING FUEL BATTERY AND FUEL BATTERY SYSTEM FOR MOBILE TERMINAL EQUIPMENT

CROSS-REFERENCE TO RELATED APPLICATIONS

This application is based upon and claims the benefit of priority from prior Japanese Patent Applications No. 2006-193067, filed Jul. 13, 2006; and No. 2007-172135, filed Jun. 29, 2007, the entire contents of both of which are incorporated herein by reference.

BACKGROUND OF THE INVENTION

1. Field of the Invention

The present invention relates to mobile terminal equipment using a fuel battery using a hydrogen-storage alloy container as a power source and a fuel battery system for mobile terminal equipment.

2. Description of the Related Art

Due to weight reduction, convenience, or the like, a fuel battery utilizing hydrogen, methanol, or the like is thought to be used as a fuel battery for various information processing units such as a video camera, a notebook-type personal computer, a mobile phone, or a personal digital assistant (PDA).

Specifically, regarding mobile equipment using a hydrogen storage container applied with hydrogen storage material, in particular, a structure of a battery receiving chamber in mobile equipment, a camera, or the like has been proposed.

In Jpn. Pat. Appln. KOKAI Publication No. 2005-174774, such a constitution has been disclosed that material (Mortpren) with elasticity capable of retaining moisture is fixed on a lid configured to allow removal and insertion of a fuel battery in mobile equipment so that the material is pressed against a drain outlet of the fuel battery when the fuel battery is inserted into a camera.

Further, in Jpn. Pat. Appln. KOKAI Publication No. 2004-362786, such an art is disclosed that hydrogen storage container is a rectangular parallelepiped (30 mm*50 mm) which is short in a thickness direction and a fuel battery cell is disposed on a hydrogen storage container casing in a closely contacting manner along a thickness direction. As an example of an outside dimension of the hydrogen storage container casing, as a material constituting a rectangular-shaped hydrogen storage container casing, such metal as aluminum or stainless steel is used for withstanding pressure of the hydrogen storage container. An opening and closing valve, a pressure sensor, and a pressure adjuster which are microfabricated are formed on the same supporting substrate.

BRIEF SUMMARY OF THE INVENTION

Therefore, an object of the present invention is to provide mobile terminal equipment using a fuel battery which can reliably maintain a space section without reducing a space between a vent hole of a fuel battery cell and an inner surface of a battery receiving chamber when a battery lid is closed, and a fuel battery system for the mobile terminal equipment.

Therefore, an object of the present invention is to provide

Mobile terminal equipment which uses a fuel battery, including a battery receiving chamber to be loaded with a fuel battery comprising a hydrogen storage alloy container, a control valve, and a fuel battery cell, comprising:

an inner surface of the battery receiving chamber;

a protrusion section provided on the fuel battery cell; and a space section formed by contact between the inner surface of the battery receiving chamber and the protrusion occurring when the battery receiving chamber is loaded with the fuel battery.

Another object of the present invention is to provide a fuel battery system for mobile terminal equipment, including a fuel battery comprising a hydrogen storage alloy container, a fuel battery cell, an opening and closing valve, a control valve, and a pressure sensor for detection, and further comprising a battery receiving chamber to which the fuel battery is detachably attached and a secondary battery, where the opening and closing valve, the control valve, and the pressure sensor for detection are activated by the secondary battery, comprising:

a plurality of protrusion sections provided on at least one side face of the fuel battery cell in an insertion direction thereof;

a predetermined inner surface of the battery receiving chamber provided opposite to the protrusion sections so that the inner surface comes in contact with the protrusion sections when the fuel battery is inserted into the battery receiving chamber; and a space section which is formed between the protrusion sections and the predetermined inner surface when the battery receiving chamber is loaded with the fuel battery.

Still another object of the present invention is to provide electronic equipment using a fuel battery, comprising a fuel battery cell main body including a fuel tank using hydrogen as fuel, a pressure control valve, and a battery cell, and a vent hole provided near a grip and connected externally, wherein the vent hole is disposed near an oxygen electrode of the battery cell and a part of the vent hole and the oxygen electrode are spatially connected to each other, and the fuel tank can be detachably attached to a frame member formed with a fuel supply path connecting the fuel tank and the control valve.

According to the present invention, mobile terminal equipment using a fuel battery that can reliably maintain a space section without reducing a space between a vent hole of a fuel battery cell and an inner surface of a battery receiving chamber when a battery lid is closed, and a fuel battery system for the mobile terminal equipment are provided.

Furthermore, it is possible to cause a plurality of power source terminals disposed on a terminal assembly and a plurality of power source terminals provided on a battery receiving chamber to coincide with each other.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently referred embodiments of the invention, and together with the general description given above and the detailed description of the embodiments given below, serve to explain the principles of the invention.

FIG. 2A is a sectional view taken along line A-A' in FIG. 2B, and FIG. 2B is a partially-cut side view;

FIGS. 4A and 4B show another example of protrusion sections on an outer surface of the fuel battery (fuel battery cell unit) and vent holes of an air flow path, FIG. 4A is a top view of the fuel battery cell unit, and FIG. 4B is a side view from the right side in FIG. 4A;

FIGS. 5A and 5B show further another example of protrusion sections on an outer surface of the fuel battery (fuel battery cell unit) and vent holes of an air flow path, FIG. 5A is a top view of the fuel battery cell unit, and FIG. 5B is a side view from the right side in FIG. 5A;

FIGS. 14A and 14B show a schematic configuration of a single-lens reflex electronic camera with interchangeable lenses including an interchangeable lens mounting portion as mobile terminal equipment according to a third embodiment of the present invention, FIG. 14A is a partially-cut front view of an electronic camera main body in a state in which an interchangeable lens has been removed, and FIG. 14B is a perspective view of the electronic camera main body in a state in which the interchangeable lens has been removed, viewed from above;

FIG. 15A is a partially-enlarged view of a part of the electronic camera in FIG. 14B, and FIG. 15B is a view showing an example in which an S-shaped plastic cable 446 made of plastic synthetic resin is connected in place of a bellows-type connecting pipe 418;

FIGS. 16A and 16B show a configuration example of a heat pipe which is a heat radiating member, FIG. 16A is a sectional view taken along an axial direction of the heat pipe, and FIG. 16B is a sectional view taken along a direction perpendicular to the axial direction of the heat pipe;

FIGS. 17A and 17B show another configuration example of a heat radiating member, FIG. 17A is an external view showing a heat sink, and FIG. 17B is a partially-enlarged sectional view of a heat sink for heat absorption;

FIG. 19 is a view for explaining a modification of the single-lens reflex electronic camera according to the third embodiment of the present invention.

DETAILED DESCRIPTION OF THE INVENTION

Hereinafter, with reference to the drawings, embodiments of the present invention will be explained.

(First Embodiment)

First, a structure of a fuel battery (hereinafter, called a "fuel battery cell unit") and mobile terminal equipment (specifically, for example, a device load unit (an electronic camera) mounted on an apparatus main body [cradle]) having a battery receiving chamber receiving the fuel battery relating to the present invention will be explained.

Figure 1:
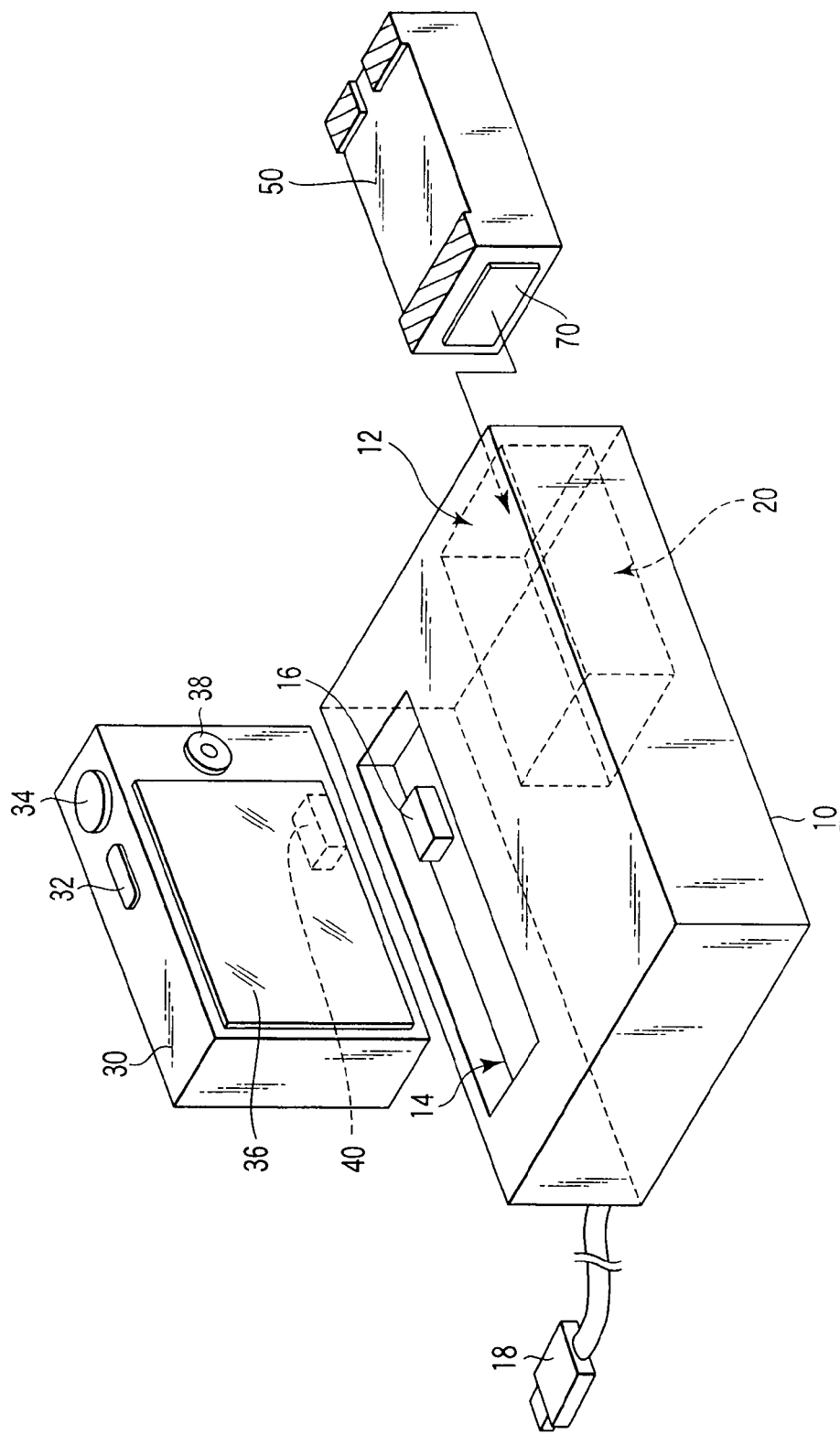
FIG. 1 is a perspective view showing an appearance of an apparatus main body which receives a device load unit (for example, an electronic camera) as mobile terminal equipment and a fuel battery (fuel battery cell unit) for the device load unit according to a first embodiment of the present invention.
Figure 2A:
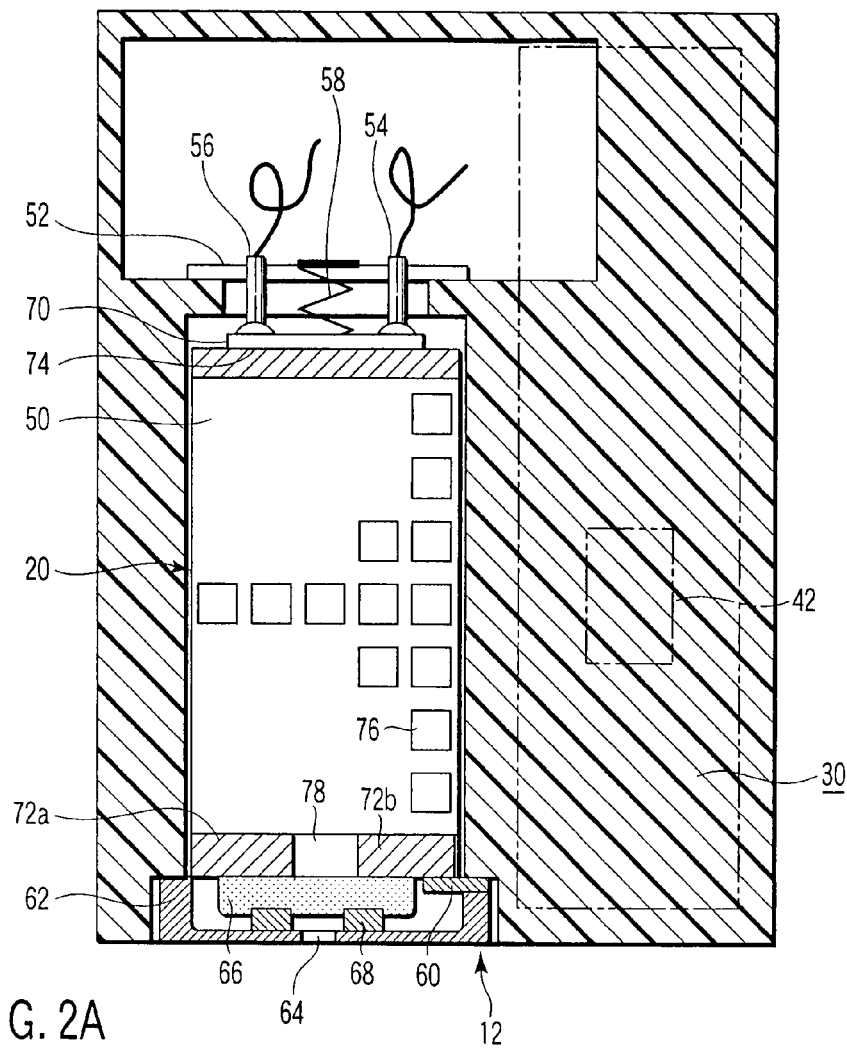
FIGS. 2A and 2B show a state in which the apparatus main body has been loaded with the device load unit in FIG. 1.
Figure 2B:
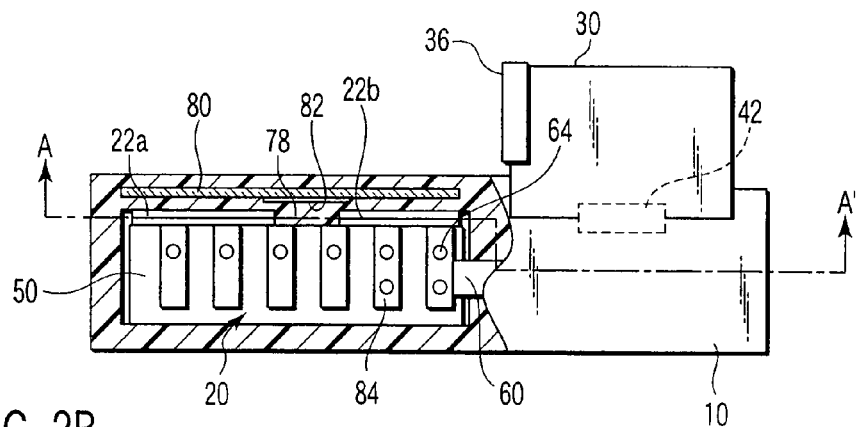

FIG. 1 is a perspective view showing an appearance of the apparatus main body which receives the device load unit as mobile terminal equipment and a fuel battery cell unit for the device load unit according to a first embodiment of the present invention, and FIGS. 2A and 2B show a state in which the apparatus main body has been loaded with the device load unit in FIG. 1, FIG. 2A is a sectional view taken along line A-A' in FIG. 2B and FIG. 2B is a partially-cut side view.

Incidentally, in the present embodiment, a state in which a hydrogen storage alloy container (fuel tank), a control valve, and a fuel battery cell unit are integrated is called as "fuel battery cell unit 50", and the device load unit is regarded as the electronic camera (hereinafter, referred to as "device load unit 30") which is mobile terminal equipment.

An apparatus main body (cradle) 10 loaded with the device load unit 30 is made of synthetic resin such as polyphenylene sulfide (PPS), acrylonitrile butadiene styrene (ABS), or polycarbonate (PC) which is filled with glass fiber. In order to be capable of loading with a fuel battery cell unit 50 (described later) provided on its insertion face with a terminal assembly 70 in the apparatus main body 10, an insertion port 12 and a battery receiving chamber 20 are provided on a part of a side face of the apparatus main body 10. In FIG. 1, a recess section 14 for allowing the device load unit 30 to be loaded is formed on an upper face portion of the apparatus main body 10. A cradle-side connecting connector 16 for charging a rechargeable battery (not shown) of the device load unit 30 is provided in the recess 14. Further, a USB terminal 18 for performing data transmission and reception with an external device (not shown) (for example, a personal computer [PC] or printer) is provided on an outer portion of the apparatus main body 10. Thereby, the apparatus main body 10 can allow two-way communication with the external device (not shown) connected via the USB terminal 18.

Incidentally, the apparatus main body 10 includes not the USB terminal 18 but also is connectable with, a power cable (not shown) or the like when a fuel battery cell is not used in a room or the like, and it is preferable that the USB terminal 18 and the power cable be attachable and detachable.

A power switch button 32 and a shutter button 34 for performing photographing or playing operation, a display apparatus 36 for displaying a photographic subject as finder function, a user operation button 38 for performing various operations, and the like are provided on the device load unit (an electronic camera) 30. A camera connector 40 to be fitted by insertion into the cradle-side connecting connector 16 of the apparatus main body 10 is provided on a lower face of the device load unit 30.

A control circuit (not shown) is provided inside the apparatus main body 10. The control circuit controls communication with the device load unit 30 connected via the cradle-side connecting connector 16 to transfer and receive data, and performs display on the display apparatus 36, control by the user operation button 38, communication control with an external device (not shown), and the like.

When the apparatus main body 10 is loaded with the device load unit 30, the camera connector 40 and the cradle-side connecting connector 16 are connected to each other in conjunction with the loading operation. Incidentally, the connection between the camera connector 40 and the cradle-side connecting connector 16 is shown as a connector connecting terminal 42 in FIGS. 2A and 2B. The device load unit 30 is placed on the apparatus main body 10, and the camera-side connecting connector 40 is connected to the cradle-side connecting connector 16. The control circuit (control circuit CPU shown in FIG. 6A described later) in the apparatus main body 10 automatically detects connection of the device load unit 30 to perform two-way communication with the control circuit (CPU) (not shown). Thereafter, a secondary battery in the device load unit 30 activates the fuel battery cell unit 50. Power to be supplied is fed to the device load unit 30 side from a fuel battery cell of the activated fuel battery cell unit 50. For example, after an image formed by an imaging lens is received by an imaging device, written in a flash memory temporarily, and subjected to image compression, such processing as writing image data in a memory card is executed. After the image data which has been stored in the device load unit 30 is written in the memory card (not shown), the image data of the flash memory in the device load unit 30 is erased. When a user stops the operation of the device load unit 30 using the switch button 32, the control circuit of the apparatus main body causes the fuel battery cell to supply electric power to the secondary battery to charge the secondary battery. Then, the control circuit of the apparatus main body 10 stops after a predetermined time elapses.

Further, such a constitution may be adopted that the aforementioned backup function and an image transfer processing function performed by user operation can be selectively switched.

As a modification of the embodiment, a mass storage apparatus (hard disk drive or the like) may be incorporated in the apparatus main body 10 in place of a memory card.

The battery receiving chamber 20 is provided in the apparatus main body 10 for inserting the fuel battery cell unit 50 from the insertion port 12 for loading. A printed board 52 is fixed on a side face of the battery receiving chamber 20. A power source terminal 54 comprising a first power source terminal for supplying power to the fuel battery cell unit 50, a opening and closing valve and a pressure adjusting valve (not shown) and a second power source terminal for supplying power to the device load unit 30 from the fuel battery cell and signal terminals 56 for a temperature sensor and a pressure sensor for detection described later are provided on the printed board 52. Further, a compressed coil spring 58 for pushing the fuel battery cell unit 50 to a retaining member 60 of a pivoting slide lever type at a known switch terminal for battery loading detection is fixed in the battery receiving chamber 20.

A battery lid 62 is provided on the insertion port 12 side of the apparatus main body 10. A Moltpren member 66 connected to a vent hole 64 through which external air for cooling evaporation heat from the fuel battery cell unit 50 flows is joined to the battery lid 62. The Moltpren member 66 always comes in contact with a plurality of vent holes 64 disposed on a side face of the fuel battery cell unit 50 through a plate spring 68 between the Moltpren 66 and the bottom face of the battery lid 62.

On the other hand, rectangular-shaped protrusion sections 72a, 72b, and 74 are formed on both end portions on an upper surface of the fuel battery cell unit 50 side. Further, many rectangular-shaped vent holes 76 for supplying air are formed on the surface of the fuel battery cell unit 50. Air supplied through the vent holes 76 arrives at a cathode which is an oxygen electrode of the fuel battery cell unit 50.

As shown in FIG. 2B, two battery receiving guide faces 22a and 22b are formed on the upper face of the fuel battery receiving chamber 20. The battery receiving guide faces 22a and 22b are disposed opposite to the protrusion sections 72a and 72b of the battery cell unit 50, respectively.

As described above, since the two battery receiving guide faces 22a and 22b are provided in the battery receiving chamber 20, a space section 78 which is a region supplying air to the vent holes 76 of the fuel battery cell unit 50 and a space section positioned between the two battery receiving guide faces 22a and 22b can be connected to each other. Therefore, a sectional area in a vertical direction of a space section shown in FIG. 2B is increased, which can reduce shortage of air from the vent holes of the fuel battery cell unit 50.

A heat storage member 80 obtained according to insert molding for storing heat temporarily is disposed above the battery receiving chamber 30 in the apparatus main body 10. The heat storage member 80 has its melting point, for example, at about 45 to 60° C., and is made of paraffin, wax, sodium nitrate hydrate or the like.

In FIG. 2B, a temperature sensor 82 is directly attached on a lower face of the heat storage member 80. However, if the temperature sensor 82 has a sheet-like shape, the temperature sensor 82 may be attached on an inner surface of the heat storage member 80. In the embodiment, the temperature sensor 82 is attached on the lower face of the hear storage member 80, but the present invention is not limited thereto, the temperature sensor 82 may be provided on an upper face of the hear storage member 80 or may be provided on both upper and lower faces thereof. Further, the heat storage member 80 may be provided on the upper and lower faces of the battery receiving chamber.

In order to cancel rattle (looseness) due to a space section between the side face of the fuel battery cell unit 50 and the side wall of the battery receiving chamber 20, a pushing member (not shown) such as a plate spring is interposed between the right side face of the battery receiving chamber 20 and the right side face of the fuel battery cell unit 50 opposite thereto shown in FIG. 2A to push the left side face of the fuel battery cell unit 50 to the side face of the battery receiving chamber 20 opposite thereto, thereby the fuel battery cell unit 50 can be stably held in the battery receiving chamber 20.

When the fuel battery cell unit 50 is inserted into the battery receiving chamber 20, the protrusion sections 72a, 72b, and 74 of the fuel battery cell unit 50 push the inner wall surface of the battery receiving chamber 20, so that the space section 78 is formed between the vent holes 76 of the fuel battery cell unit 50 and the inner wall surface of the battery receiving chamber 20. With such a structure, there is an advantage that, when the fuel battery cell unit 50 has the same outer shape as a commercially-available lithium battery has, the lithium battery is prevented from being inserted into the battery receiving chamber of the mobile terminal equipment.

A undulation-shaped fin is formed on one side face of the fuel battery cell unit 50, in this case, on a face which is the innermost portion thereof when the fuel battery cell unit 50 is loaded in the apparatus main body 10, and a plurality of vent holes for applying atmosphere pressure to the opening and closing valve, the pressure sensor for detection, and a diaphragm of a control value (hereinafter, called a pressure adjusting valve) is provided at a plurality of recess sections. A space section is provided at the center of the fuel battery cell unit 50, and the space section serves as an air flow path for cooling heat generated by the fuel battery cell unit 50 due to contact with external air.

A lot of the vent holes 64 for supplying air are provided on a recess section 84 on the outer surface comprising five faces except for the terminal assembly 70 in the fuel battery cell unit 50. It is important to insert the fuel battery cell unit 50 into the apparatus main body 10 without blocking the vent holes 64 in order to lessen a burden to the fuel battery cell unit 50.

Specifically, the space section 78 is provided on the side of the fuel battery cell unit 50 between the inner wall surface of the battery receiving chamber 20 and the outer surface of the fuel battery cell unit 50. When the fuel battery cell unit 50 is loaded in the battery receiving chamber 20, the fuel battery cell unit 50 is fixed by the retaining member 60 of a pivoting slide lever type at the switch terminal for battery loading detection. When the inside upper surface of the battery receiving chamber 20 is brought in contact with the protrusion sections 72a, 72b, and 74 positioned on the side of a fuel battery of the fuel battery cell unit 50, the fuel battery cell unit 50 is prevented from moving vertically while the mobile terminal equipment is being carried.

A plurality of undulation-shaped fins are provided on a side face of the fuel battery cell unit 50, and the plurality of vent holes 64 for applying atmosphere pressure to the opening and closing valve, the pressure sensor for detection, and a diaphragm of the pressure adjusting valve is provided at a plurality of recesses. The space section 78 is provided at the center of the fuel battery cell unit 50, and the space section serves as an air flow path for cooling heat generated by the fuel battery cell unit due to contact with external air. The temperature of the fuel battery cell unit 50 can be detected by the temperature sensor 82 provided above the battery receiving chamber 30 (20) in the apparatus main body 10.

Figure 3A:
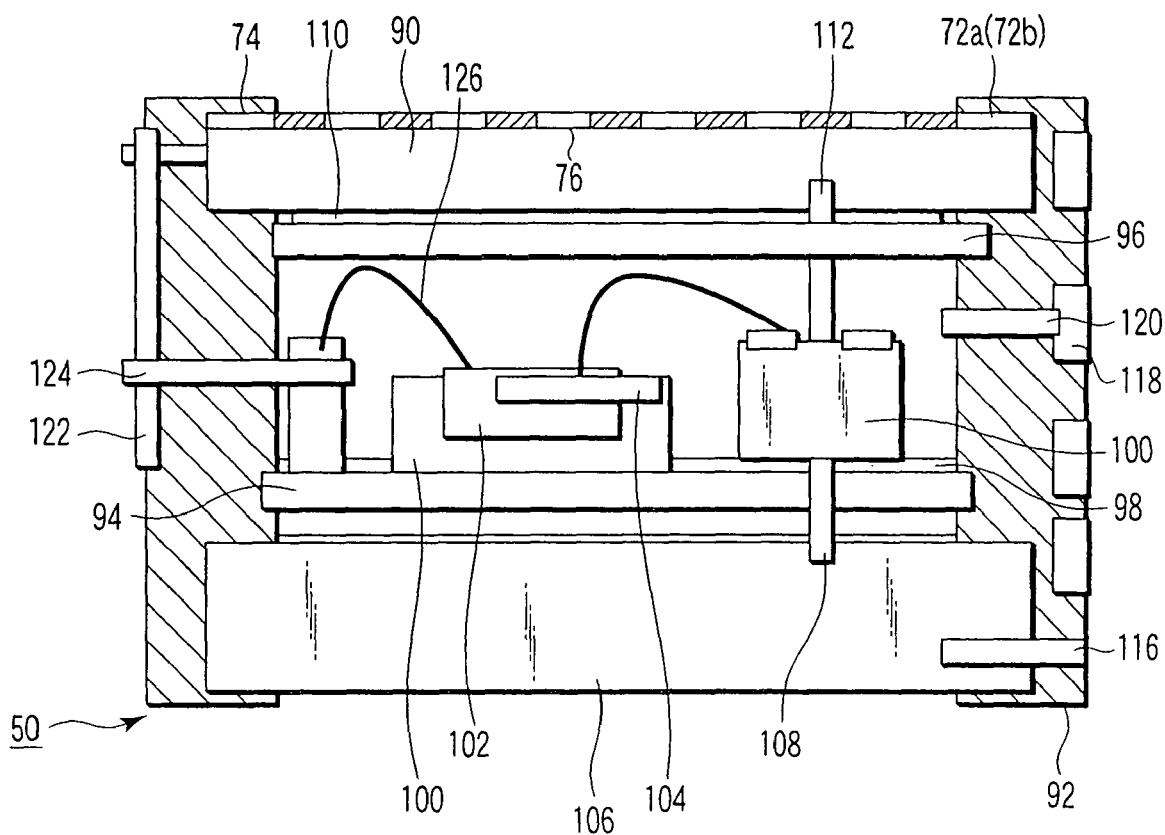
FIG. 3A is a sectional view showing a configuration of a fuel battery system to which the fuel battery (fuel battery cell unit) according to the first embodiment has been applied.

FIG. 3A is a sectional view showing a constitution of the fuel battery cell unit 90 applied with a fuel battery according to the first embodiment of the present invention.

In the FIG. 3A, the fuel battery cell unit 90 is constituted such that an upper layer of a hydrogen flow path and a lower layer thereof are provided in a hydrogen storage alloy container casing 92. The lower layer of the hydrogen flow path is provided by a first silicon substrate 98 formed on a first glass substrate 94. On the other hand, the upper layer of the hydrogen flow path is a pressure adjusting mechanism having a function of adjusting hydrogen pressure, which is applied when hydrogen is supplied to a battery cell unit 90, so as not to exceed balance pressure of the hydrogen storage alloy.

The silicon substrate 98 and a second silicon substrate 100 are disposed on the first glass substrate 94. A temperature sensor 102 or a head amplifier (HA) chip 104 for an amplitude signal amplifier circuit are embedded in the silicon substrate 100 mounted on the first glass substrate 94. On the other hand, the second silicon substrate 100 on the first silicon substrate 98 is provided with a piping route 108 extending to a hydrogen storage alloy container 106 via the first glass substrate 94 and a piping route 112 extending to the battery cell unit 90 via the second glass substrate 96 and a heat insulating member 110. The piping route 108 and the piping route 112 are connected to each other for supplying hydrogen to the battery cell unit 90.

In order to prevent electrostatic breakdown of elements of the respective pressure sensors and the pressure adjusting valve disposed in a space section between the second glass substrate 96 and the first glass substrate 94, the second glass substrate 96 is bonded on a holding plate (not shown) to be positioned in parallel with the first glass substrate 94. The battery cell unit 90 is for supplying electric power using hydrogen as fuel, and it is brought in close contact with a second glass substrate 96 via an adiabatic member 110 which is vacuum adiabatic material obtained by using conductive powder as core material, sealing the same in a bag made of nonwoven fabric, and covering the bag with an outer skin. When the vacuum adiabatic material is used, the thickness of the heat adiabatic member 110 becomes a few millimeters, so that it is desirable to bond the vacuum adiabatic material or a heat storage material sheet of phase change material (which changes from a solid to a liquid or a liquid to a solid) of 45 to 60° C. to the hydrogen storage alloy container casing 92 directly without using the second glass substrate 96. This allows for heat insulation in which heat generated from the fuel battery cell is less conducted to the hydrogen storage alloy container so that the temperature of the hydrogen storage alloy container is not suddenly increased during the operation of the fuel battery cell.

A hydrogen replenishing port 116 is provided in the hydrogen storage alloy container 106 and the hydrogen storage alloy container casing 92. The hydrogen replenishing port 116 is attachable and detachable and has such a mechanism that its valve is opened by connecting the hydrogen replenishing port 116 to the hydrogen storage alloy container 106 and the hydrogen storage alloy container casing 92. A hydrogen replenishing bomb such as a hydrogen generator generating hydrogen using perforated material such as methanol, ethanol, or dimethyl ether is connected to the hydrogen replenishing port 116 to inject hydrogen thereto, so that hydrogen is replenished and stored in the hydrogen storage alloy in the hydrogen storage alloy container 106.

The hydrogen storage alloy container 106 is a rectangular parallelepiped which is short in a thickness direction, and the battery cell unit 90 is disposed on the hydrogen storage alloy container 106 so as to closely contact with the same in a thickness direction. As an example of the outside dimension of the hydrogen storage container casing 92, such metal as aluminum or stainless steel is used as material constituting the rectangular-shaped hydrogen storage alloy container casing 92 in order to endure pressure of the hydrogen storage alloy container 106. In a case of aluminum, a plurality of cooling fins 118 are formed by working many grooves or the like on the outer surface of the hydrogen storage alloy container casing 92.

An air suction port 120 is inserted into the battery cell unit 90 or between the first glass substrate 94 and the second glass substrate 96. By providing an opening at a groove portion of the fin 118 except for one face of the hydrogen storage alloy container casing 92 attached with a terminal assembly 122, the air suction port 120 can draw air without being prevented by the compressed coil spring (not shown in FIGS. 3A and 3B) 58 for pushing the mobile equipment to a terminal of the terminal assembly 122 at the time of insertion.

Since heat generated from the fuel battery cell unit 50 can be insulated by interposing the heat insulating member 110 between the battery cell unit 90 and the second glass substrate 96, false detection of the temperature sensor 102 disposed on the second silicon substrate 100 can be prevented. Besides a pin terminal 124, the power source terminal 54 and the signal terminal 56 which are described above are coupled to the substrate for a terminal 122. The pin terminal 124, the temperature sensor 102, the HA chip 104, and a relay terminal assembly are connected to each other by bonding wires 126.

Figure 3B:
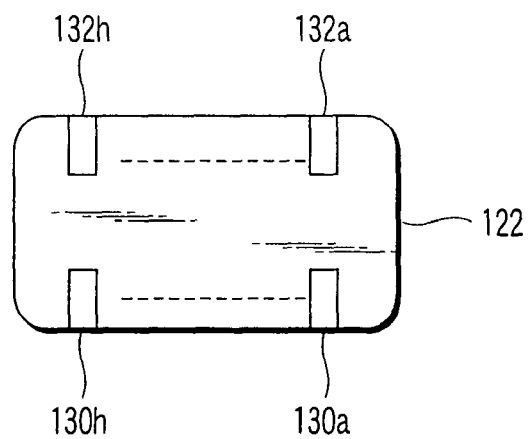
FIG. 3B is a configuration view showing an arrangement example of a terminal base plate 122 of FIG. 3A.

As shown in FIG. 3B, eight terminals of signal lines (signal terminals) 130a to 130h and eight terminals of drive lines (power source terminals) 132a to 132h are provided on the terminal assembly 122. The signal lines (signal terminals) 130a to 130h transmit signals to a control circuit (CPU) 188 from a temperature sensor, a pressure sensor for detection, and the pressure adjusting valve which are described later. The drive lines (power source terminals) 132a to 132h are drive lines for supplying electric power to the device load unit and the secondary battery from the battery cell unit 90 side and drive wires for supplying electric power to the opening and closing valve, a safety valve, the pressure sensor for detection, or the pressure adjusting valve from the secondary battery.

As described above, the two different pairs of drive wires for supplying electric power are disposed on the same substrate for a terminal, the number of assembling steps can be reduced and the interior of the fuel battery system can be simplified without conducting wiring in the fuel battery system. Incidentally, a pressure adjusting mechanism is constituted between the first glass substrate 94 and the second glass substrate 96.

Balanced pressure of the hydrogen storage alloy varies according to change of a temperature of the hydrogen storage alloy, and the balanced pressure increases according to temperature rise. For example, when hydrogen storage alloy whose major component is LaNi5 of AB5 type is used, it is preferable that, on the assumption that the temperature of usage environment is in a range of about 0 to 45° C., material for hydrogen storage alloy whose balanced pressure at 20° C. is in a range of about 0.25 to 0.35 MPa be used such that the balanced pressure at 0° C. is normal pressure or more, the balanced pressure at 45° C. does not exceed 0.6 MPa, and the balanced pressure at 60° C. does not exceed 1.0 MPa. By combining the hydrogen storage alloy container casing 92 with the battery cell unit 90 to integrate paths from the hydrogen storage alloy container 106 to the battery cell unit 90, the fuel battery system of the present invention is achieved. The temperature sensor 102 is provided for measuring a temperature inside such a hydrogen storage alloy container casing 92.

FIGS. 4A, 4B and FIGS. 5A, 5B show other examples of the protrusion sections on the outer surface of the fuel battery cell unit 50 and the vent holes of the air flow path, FIGS. 4A and 5A are views from the upper face of the fuel battery cell unit 50, and FIGS. 4B and 5B are views from the right side directions in FIGS. 4A and 5A.

In the example of FIGS. 4A and 4B, the rectangular shaped protrusion sections 72a, 72b, and 74 are formed at three portions. The rectangular-shaped vent holes 76 are provided. In the example, the area of the vent holes to the area of the protrusion sections in the fuel battery cell unit 50 shown in FIGS. 2A and 2B is increased. Further, an opening in contact with the Mortpren member is made wide to ensure proper airflow. Incidentally, reference number 136 in FIG. 4B denotes a notch for preventing wrong insertion. In this case, if the battery receiving chamber 20 is formed into a shape fitting the notch 136, wrong insertion of something other than the fuel battery cell unit 50 can be prevented.

In the example in FIGS. 5A and 5B, the rectangular-shaped protrusion sections 138 are provided at three side edges, and a plurality of circular protrusion sections 140 are provided at the center. Two kinds of vent holes of a plurality of circular vent holes 142 and a plurality of slender rectangular vent holes 144 are provided. If the area of the vent holes is increased for ensuring proper airflow, the vent holes with low rigidity become easy to get broken. The circular protrusion sections 140 are provided at the center so that the vent holes will not get broken.

By the way, when a pair of drive electrode plates is used in the hydrogen storage alloy container to measure a remaining amount capacity, when a known distortion gauge is used to measure a remaining hydrogen amount (Jpn. Pat. Appin. KOKAI Publication No. 06-66787), or the like, before factory shipment, the same container as the product is secondarily worked for obtaining a data characteristic table in advance to attach a thermo-module on the outer surface of the container for allowing output of the temperature sensor to vary with respect to each temperature of 20, 23, 27, 30, 32, 35, 40, and 45° C. A valve of the hydrogen storage alloy container is opened to obtain a discharged hydrogen amount with a hydrogen flowmeter with respect to each temperature. That is, in the constitution of the fuel battery cell unit, a relationship between a total consumption time of the fuel battery at each discharged hydrogen amount can be obtained.

Remaining amount display is performed in a form of percentage display of a remaining amount time or (remaining amount time/total consumption time), and the remaining amount time is obtained by subtracting accumulation of the number of use times and the using time of the pressure adjusting valve and the safety valve from the total consumption time. Further, PCT coefficient at each temperature is determined, and correlation (weighting) is determined in advance. Data obtained here is stored in a ROM. Thereby, a remaining amount detecting sensor provided in the hydrogen storage alloy container can also be omitted.

By disposing a thermo-module (for example, a Peltier device) wiring substrate on a recessed face of the outer surface of the hydrogen storage alloy container casing made of stainless steel material which is metal material, temperature control to 20° C. (common temperature) can be performed by the CPU. As a result, an output signal of the pressure sensor can be stabilized. Therefore, data only near the common temperature (20° C.) can be stored. Therefore, memory capacity of a memory (for example, a ROM or the like) can be reduced to a large extent.

As described later, mobile electronic equipment (for example, a cradle) is provided with a secondary charger for initially driving a CPU, a opening and closing valve, a pressure sensor for detection, and a pressure adjusting valve, a current detector for detecting a remaining amount of a secondary battery, a changeover switch, a memory in which the data obtained according to temperature variation is stored, a remaining amount display of a fuel battery, and a user operation input key.

Figure 6A:
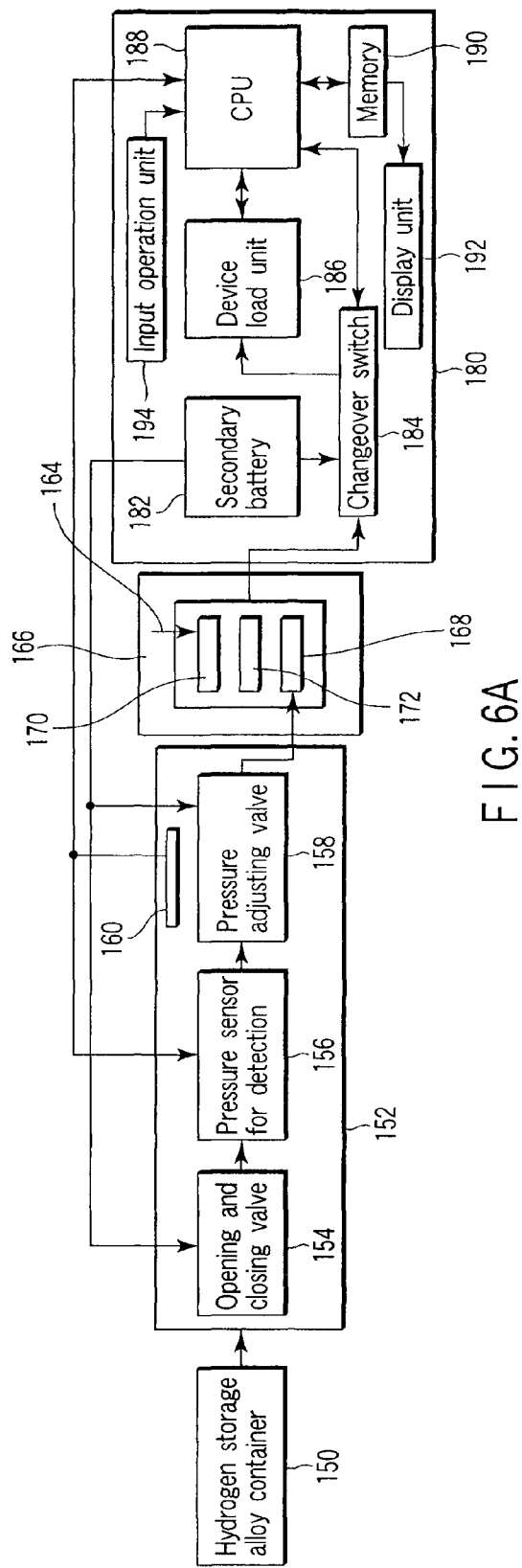
FIG. 6A is a block configuration diagram for explaining a combination of a fuel battery system and a remaining amount display of electronic equipment in which a secondary battery, a CPU, and the like are incorporated.
Figure 6B:
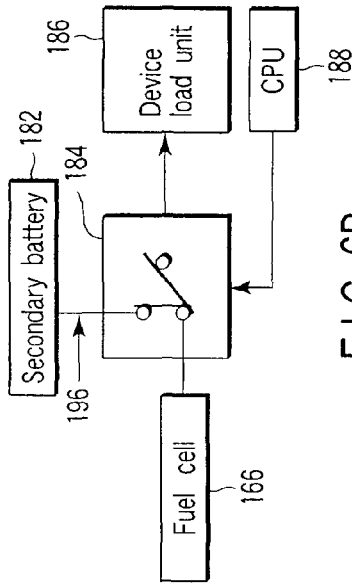
FIG. 6B is a block diagram for explaining switching between a fuel battery cell 166 and a secondary battery 182.

Here, with reference to FIGS. 6A and 6B, a combination of a fuel battery system incorporated with a battery receiving chamber in which a fuel battery cell unit can be loaded, a secondary battery, and a CPU, and a remaining amount display of electronic equipment using the fuel battery system will be explained.

A hydrogen storage alloy casing is formed with a hydrogen storage alloy container 150, and an opening and closing valve 154, a pressure sensor for detection 156, and a pressure adjusting valve 158 which are disposed on a silicon substrate 152, and further has a temperature sensor 160. A fuel battery cell 166 comprises an anode (fuel electrode) 168, a cathode (oxygen electrode) 170, and a solid polymer electrolytic film 172. Mobile electronic equipment (for example, a cradle) 180 is provided with the CPU 188, a secondary charger (secondary battery) 182 for initially driving the opening and closing valve 154, the pressure sensor for detection 156, and the pressure adjusting valve 158 which are described above, a current detector for detecting a remaining amount of the secondary battery 182 and an electronic camera (device load unit) 186, a changeover switch 184 for switching charge between the device load unit 186 and the secondary battery 182 which are supplied with electric power from the fuel battery cell 166, a memory 190 in which the data obtained according to temperature variation is stored, a display unit 192 for performing remaining amount display of a fuel battery, and an input operation unit 194 comprising an input key for user operation. Incidentally, reference number 164 in FIG. 6A denotes air suction.

A piping route from the pressure adjusting valve 158 is connected to the anode (fuel electrode) 168. The CPU (control circuit) 188 monitors output signals of the temperature sensor 160 and the pressure sensor for detection 156 which are embedded in the silicon substrate 152. Further, the CPU 188 monitors remaining amount display of the fuel battery cell 166 and a current value of the device load unit 186. The CPU 188 can perform remaining amount detection based upon an output signal of the device load unit 186 by the changeover switch 184 when the fuel battery cell 166 is connected to the electronic machine 180. However, the output signal of the device load unit 186 is set aside, and an output signal of the pressure sensor for detection 156 and an output signal from the temperature sensor 160 are given preference, and based upon the type and the temperature characteristic of a hydrogen storage alloy container of AB5 type which is a hydrogen storage alloy container of B company which is stored in the memory 190 and designated by a user, a remaining amount calculation value of the data is utilized to perform displaying on the display unit (display) 192. Thereby, a user can confirm the remaining amount.

At a start time when an operation start signal of the device load unit 186 is inputted, the CPU 188 actuates the secondary battery 182. The secondary battery 182 supplies electric power to the opening and closing valve, the pressure sensor for detection, and the pressure adjusting valve. After the opening and closing valve is opened, outputs of the temperature sensor and the pressure sensor for detection are monitored to calculate a remaining capacity of a fuel tank, and the remaining capacity is then displayed on a display device. Desired hydrogen is discharged from the pressure adjusting valve to charge the secondary battery with hydrogen from the fuel battery cell. That is, as shown in FIG. 6B, the fuel battery cell 166 and the secondary battery 182 are connected (denoted by reference number 196 in FIG. 6B) at a charging time by the changeover switch 184. In the case of a cradle which is mobile equipment, when the device load unit (for example, an electronic camera or the like) 186 is loaded and the fuel battery cell 166 is actuated, the CPU 188 actuates the changeover switch 184 to halt the secondary battery 182. Then, control of the pressure adjusting valve 158 and the fuel battery cell 166 get into an operating state, and the device load unit 186 is actuated. At such a time, there is a merit that the CPU 188 can be utilized even outdoors without an outlet by using only the fuel battery cell 166 or using the fuel battery cell 166 in combination with the secondary battery 182.

Next, with reference to FIG. 7 and FIGS. 8A to 8C, a fuel battery cell unit applied with a fluid control apparatus of the present invention will be explained.

Figure 7:
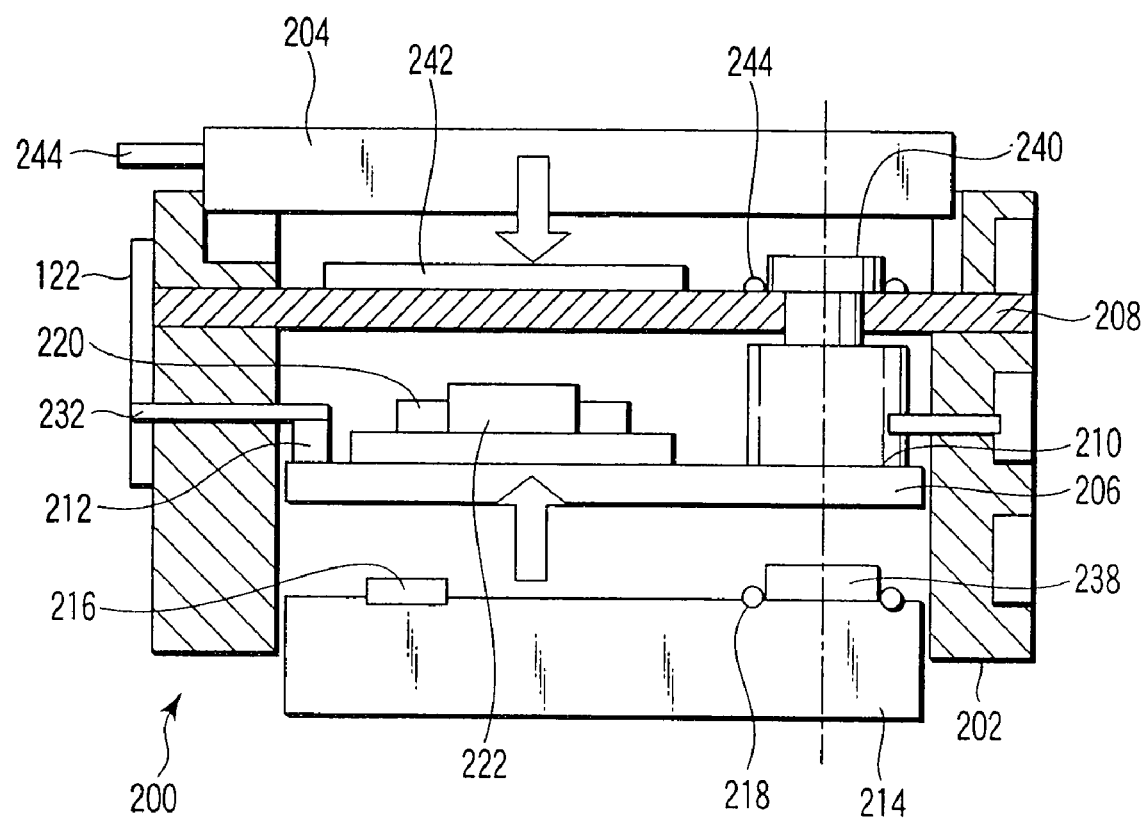
FIG. 7 is a sectional view showing the constitution of the fuel battery cell unit according to the first embodiment of the present invention.
Figure 8A:
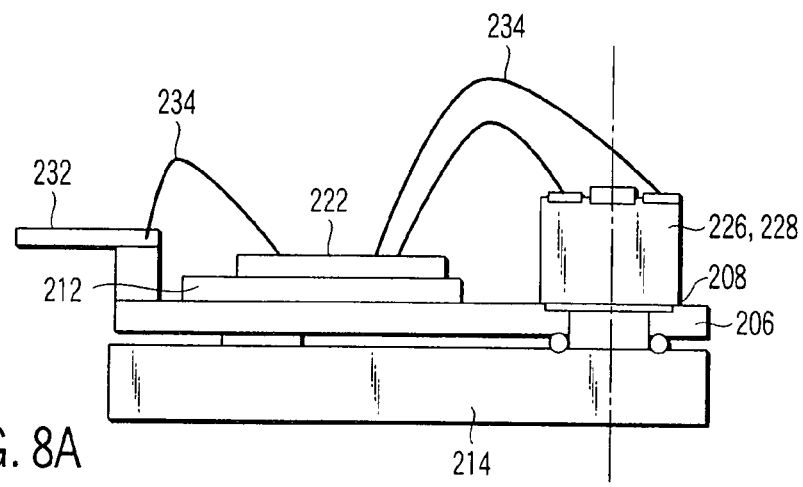
FIG. 8A is a view showing a structure of the fuel battery cell unit in a state in which a second silicon substrate, a pressure adjusting valve, an opening and closing valve, bonding wires, and the like have been assembled on a first glass substrate attached on a hydrogen storage alloy container, which constitutes the fuel battery cell unit in FIG. 7.
Figure 8B:
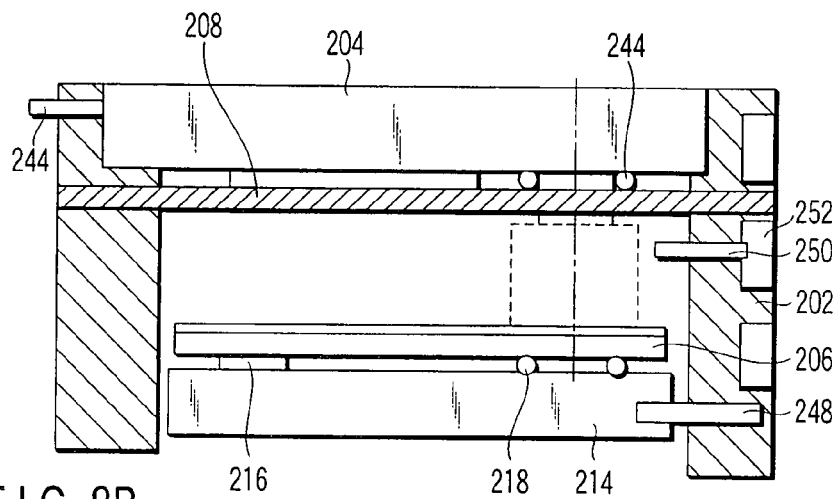
FIG. 8B is a view showing the structure of the fuel battery cell unit in a state in which the fuel battery cell unit in the state in FIG. 8A together with a second glass substrate has been assembled in a hydrogen storage alloy container casing.
Figure 8C:
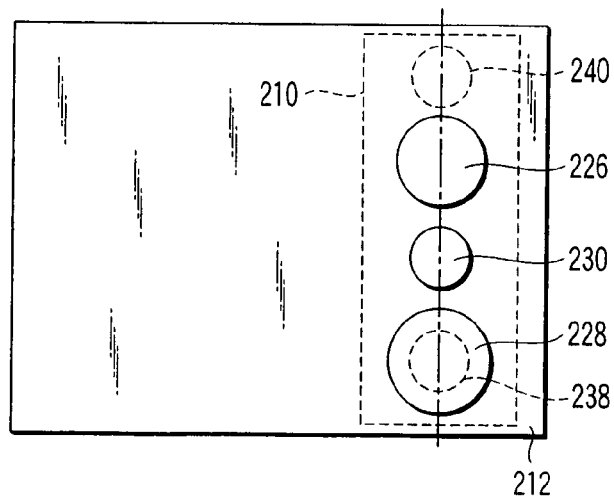
FIG. 8C is a top view showing an arrangement of the pressure adjusting valve, the opening and closing valve, and the like in FIG. 8A.

FIG. 7 is a sectional view showing the constitution of a fuel battery cell unit according to the first embodiment of the present invention. FIG. 8A is a view showing the structure of a fuel battery cell unit in a state in which a second silicon substrate, a pressure adjusting valve, an opening and closing valve, a bonding wire, and the like have been assembled on a first glass substrate attached on a hydrogen storage alloy container which constitutes the fuel battery cell unit in FIG. 7, FIG. 8B is a view showing the structure of the fuel battery cell unit in a state in which the fuel battery cell unit in the state in FIG. 8A together with a second glass substrate has been assembled in a hydrogen storage alloy container casing, and FIG. 8C is a top view showing an arrangement of a pressure adjusting valve, the opening and closing valve, and the like in FIG. 8A.

A container casing holding the hydrogen storage alloy container, a control valve, and a fuel battery cell is provided, and a heat insulating material is interposed between a first container casing holding the hydrogen storage alloy container and the control valve and a second container casing holding the fuel battery cell. Since such a constitution prevents heat generated from the fuel battery cell from being conducted to the control valve or the hydrogen alloy container, temperature rise of the control valve or the hydrogen storage alloy container can be prevent to reduce false operation.

A fuel battery cell unit 200 includes a pressure adjusting mechanism by providing a lower layer of a hydrogen flow path and an upper layer thereof in a hydrogen storage alloy container casing 202. The pressure adjusting mechanism is a mechanism having a function of adjusting hydrogen pressure produced when hydrogen is supplied to a fuel battery cell 204 so as not to exceed balanced pressure of the hydrogen storage alloy. The lower layer of the hydrogen flow path is provided by a first silicon substrate 210 formed on a first glass substrate 206. The upper layer of the hydrogen flow path is formed on a second silicon substrate 212.

The first glass substrate 206 is disposed on a hydrogen storage alloy container 214 via an inclination adjusting member 216 and an O ring (packing member) 218. The first silicon substrate 210 and the second silicon substrate 212 are disposed on the first glass substrate 206. A head amplifier (HA) chip 220 for an amplitude signal amplifier circuit (not shown), a temperature sensor and acceleration sensor 222 are embedded in the second silicon substrate 212 mounted on the first glass substrate 206.

On the other hand, a pressure adjusting valve 226, an opening and closing valve 228, a pressure sensor for detection 230, and the like are provided on the first silicon substrate 210. The temperature sensor and acceleration sensor 222 and a lead terminal 232 provided on the second silicon substrate 212 are connected to each other with a bonding wire 234, and the temperature sensor and acceleration sensor 222 and the pressure adjusting valve 226, the opening and closing valve 228, the pressure sensor for detection 230, and the like are connected to each other with bonding wires 234.

The opening and closing valve 228 is opened when connected to a piping route A238, and is closed when disconnected from the piping route A238, and is a valve for hydrogen replenishment equipped with a valve operating mechanism. The pressure sensor for detection 230 is connected to the opening and closing valve 228. The pressure adjusting valve 226 is connected to the pressure sensor for detection 230, is a valve operating mechanism which adjusts pressure for protecting a solid electrolyte film of the fuel battery cell 204, and connected to a piping route B240 which supplies hydrogen to the fuel battery cell 204.

In order to prevent electrostatic breakdown of elements of the pressure sensor 230 and the pressure adjusting valve 226 disposed in a space section between the second glass substrate 208 and the first glass substrate 206, the second glass substrate 208 is bonded on a holding plate (not shown) to be positioned in parallel with the first glass substrate 206. The fuel battery cell 204 is for supplying power utilizing hydrogen as fuel, and it is brought in close contact with a second glass substrate 208 via an adiabatic member 242 which is vacuum adiabatic material obtained by using conductive powder as core material, sealing the same in a bag made of nonwoven fabric, and covering the bag with an outer skin, and an O ring (packing member) 244. By replacing the second glass substrate by a heat storage material sheet of phase change material (which changes from a solid to a liquid or a liquid to a solid) whose phase change occurs in a temperature range of 45 to 60° C., heat insulation in which heat generated from the fuel battery cell is less conducted to the hydrogen storage alloy container, which allows for preventing sudden temperature rise of the hydrogen storage alloy container during the operation of the fuel battery cell.

The piping route A238 extending to the hydrogen storage alloy container 214 via the first glass substrate 206 is provided on the first glass substrate 206. The piping route B240 extending to the fuel battery cell 204 via the second glass substrate 208 is provided on the second glass substrate 208. The piping route A238 and the piping route A240 are connected to each other to supply hydrogen to the fuel battery cell 204. Incidentally, the fuel battery cell 204 is connected to a lead terminal 244 for connecting the fuel battery cell 204 electrically to external equipment.

A hydrogen replenishing port 248 and an air suction port 250 are provided in the hydrogen storage alloy container 214, the fuel battery cell 204, and the hydrogen storage alloy container casing 202. The hydrogen replenishing port 248 is attachable and detachable and has such a mechanism that its valve is opened by connecting the hydrogen replenishing port 116 to the hydrogen storage alloy container 214, the fuel battery cell 204, or the hydrogen storage alloy container casing 202. A hydrogen replenishing bomb such as a hydrogen generator generating hydrogen using perforated material such as methanol, ethanol, or dimethyl ether is connected to the hydrogen replenishing port 248 to inject hydrogen thereto, so that hydrogen is replenished and stored in the hydrogen storage alloy in the hydrogen storage alloy container 214.

The hydrogen storage alloy container 214 is a rectangular parallelepiped which is short in a thickness direction, and the fuel battery cell 204 is disposed on the hydrogen storage alloy container 214 so as to closely contact therewith in a thickness direction. As an example of the outside dimension of the hydrogen storage container casing 202, such metal as aluminum or stainless steel is used as material constituting the rectangular-shaped hydrogen storage alloy container casing 202 in order to endure pressure of the hydrogen storage alloy container 214. In a case of aluminum, a plurality of cooling fins 252 are formed by working many grooves or the like on the outer surface of the hydrogen storage alloy container casing 202.

The air suction port 250 inserted into the fuel battery cell 204 or between the first glass substrate 206 and the second glass substrate 208 can draw air without being prevented by a plate spring member for pushing the mobile equipment on a terminal assembly at the time of insertion by providing an opening at a groove portion of the fin except for one face of the hydrogen storage alloy container casing 202 attached with the terminal assembly. Since heat generated from the fuel battery cell 204 can be insulated by interposing the heat insulating member 242 between the battery cell unit 204 and the second glass substrate 208, false detection of the temperature sensor disposed on the second silicon substrate 212 can be prevented.

Balanced pressure of the hydrogen storage alloy varies with change of a temperature of the hydrogen storage alloy, and the balanced pressure increases according to temperature rise. For example, when hydrogen storage alloy whose major component is $LaNi_5$ of AB5 type is used, it is preferable that, on the assumption that the temperature of usage environment is in a range of about 0 to 45° C., material for hydrogen storage alloy whose balanced pressure at 20° C. is in a range of about 0.25 to 0.35 MPa be used such that the balanced pressure at 0° C. is normal pressure or more, the balanced pressure at 45° C. does not exceed 0.6 MPa, and the balanced pressure at 60° C. does not exceed 1.0 MPa. By combining the hydrogen storage alloy container casing 202 with the fuel battery cell 204 to integrate paths from the hydrogen storage alloy container 214 to the fuel battery cell 204, the fuel battery system of the present invention is achieved. The temperature sensor is provided for measuring temperature inside such a hydrogen storage alloy container casing 202.

Balanced pressure of the hydrogen storage alloy varies with change of a temperature of the hydrogen storage alloy, and the balanced pressure increases according to temperature rise. For example, when hydrogen storage alloy whose major component is $LaNi_5$ of AB5 type is used, it is preferable that, on the assumption that the temperature of usage environment is in a range of about 0 to 45° C., material for hydrogen storage alloy whose balanced pressure at 20° C. is in a range of about 0.25 to 0.35 MPa be used such that the balanced pressure at 0° C. is normal pressure or more, the balanced pressure at 45° C. does not exceed 0.6 MPa, and the balanced pressure at 60° C. does not exceed 1.0 MPa.

By combining the hydrogen storage alloy container casing with the fuel battery cell to integrate paths from the hydrogen storage alloy container to the fuel battery cell, the fuel battery of the present invention is achieved.

In the aforementioned first embodiment, the terminal assembly disposed on the side face of the hydrogen storage alloy container casing is provided with eight signal lines and eight drive lines. Second opening and closing valves can selectively be provided and used according to the hydrogen storage alloy material or the like. Besides, as the first opening and closing valve, a known mechanical electromagnetic valve may be attached to the hydrogen storage alloy container casing. Further, the second silicon substrate embedded with the temperature sensor, the head amplifier (HA) chip, and the like may be disposed on the first glass substrate separately from the first silicon substrate and the second silicon substrate.

The temperature sensor and the acceleration sensor can be embedded in the second silicon substrate.

Providing the acceleration sensor is especially advantageous in a case in which the fuel battery of the present invention is used as a liquid fuel battery or the like, because an error is generated in remaining amount detection depending on an attitude of the fuel battery when a fluid level sensor is utilized for remaining amount detection.

As described above, according to the fuel battery cell unit, since the plurality of opening and closing valves, the pressure sensor for detection, the pressure adjusting valve, and the safety valve which are disposed on the piping route for supplying hydrogen from the hydrogen storage container to the fuel battery cell are provided on the silicon substrate on the glass substrate, and the glass substrate is disposed inside the hydrogen storage container casing to integrate the same with the hydrogen storage container casing, the volume can be small, and since the safety valve is driven, the load of the pressure adjusting valve can be reduced. As a result, size reduction of the whole fuel battery for mobile equipment becomes possible.

Figure 9:
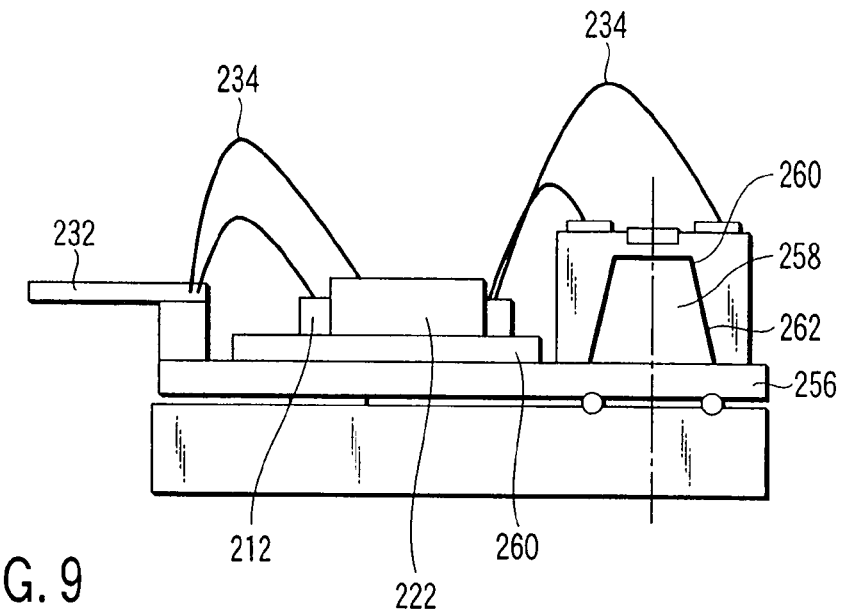
FIG. 9 is a sectional view showing the detailed constitution of a pressure adjusting mechanism of a fuel battery (fuel battery cell unit) 10 shown in FIGS. 8A-8C.

FIG. 9 is a sectional view showing the constitution of a pressure adjusting mechanism of a fuel battery cell unit 10 shown in FIGS. 8A-8C.

In FIG. 9, a hydrogen fuel chamber 258 which is a cavity section is provided between a glass substrate 256 forming a flow path on the lower face side and a pressure sensor for detection. A protection film 262 for protecting a silicon substrate 260 from corrosion caused by gas or the like is formed on the inner surface of the hydrogen fuel chamber 252.

(Second Embodiment)

Next, a second embodiment of the present invention will be explained.

Figure 10:
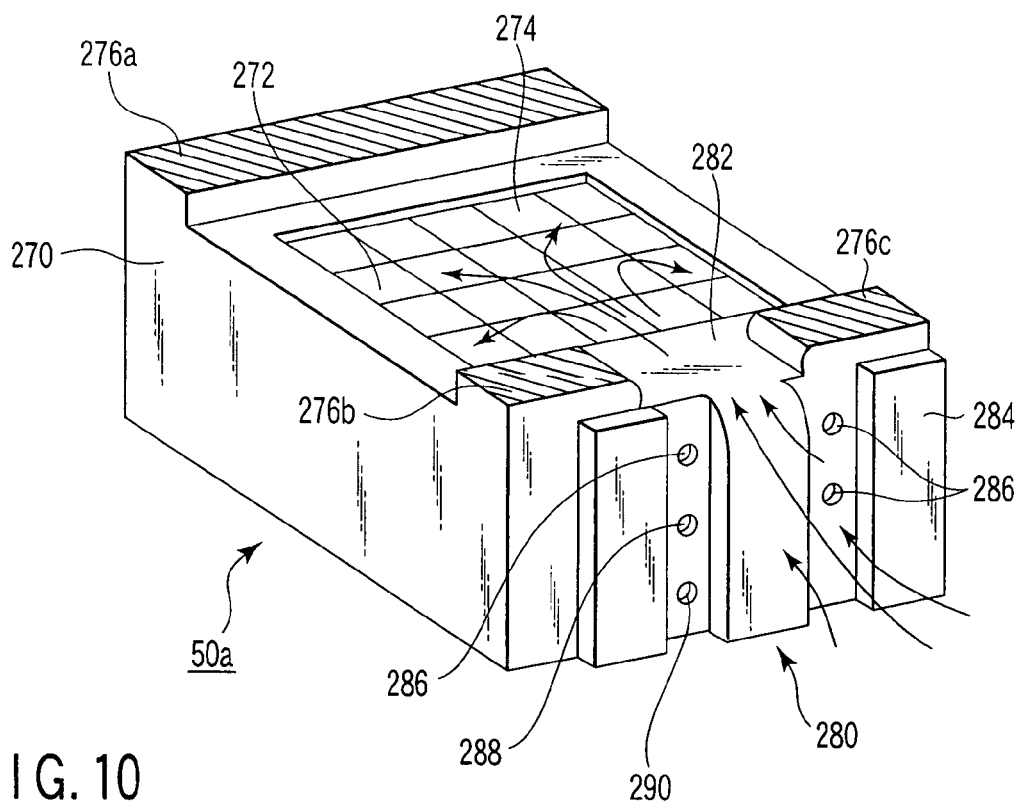
FIG. 10 is an appearance perspective view showing a structure of a fuel battery (fuel battery cell unit) 280 used in mobile terminal equipment according to a second embodiment of the present invention.
Figure 11:
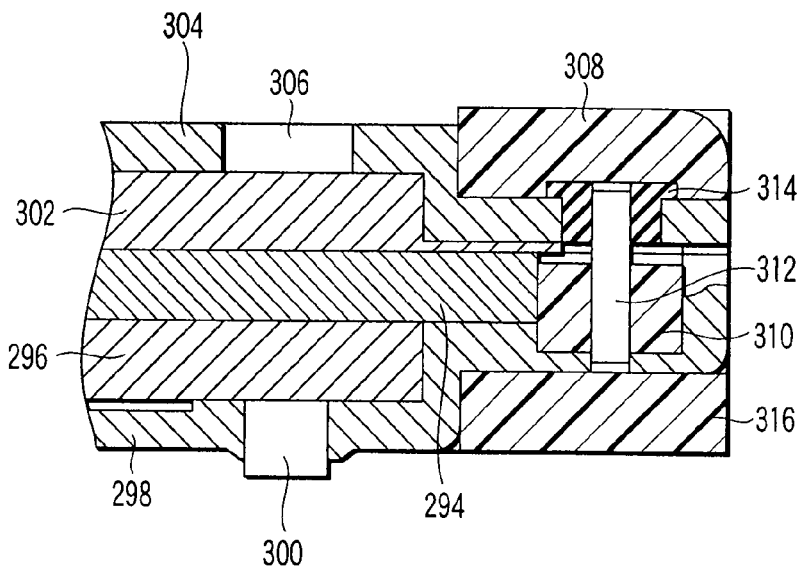
FIG. 11 is a sectional view showing the structure of a part of the fuel battery cell unit in FIG. 10 according to the second embodiment of the present invention.
Figure 12:
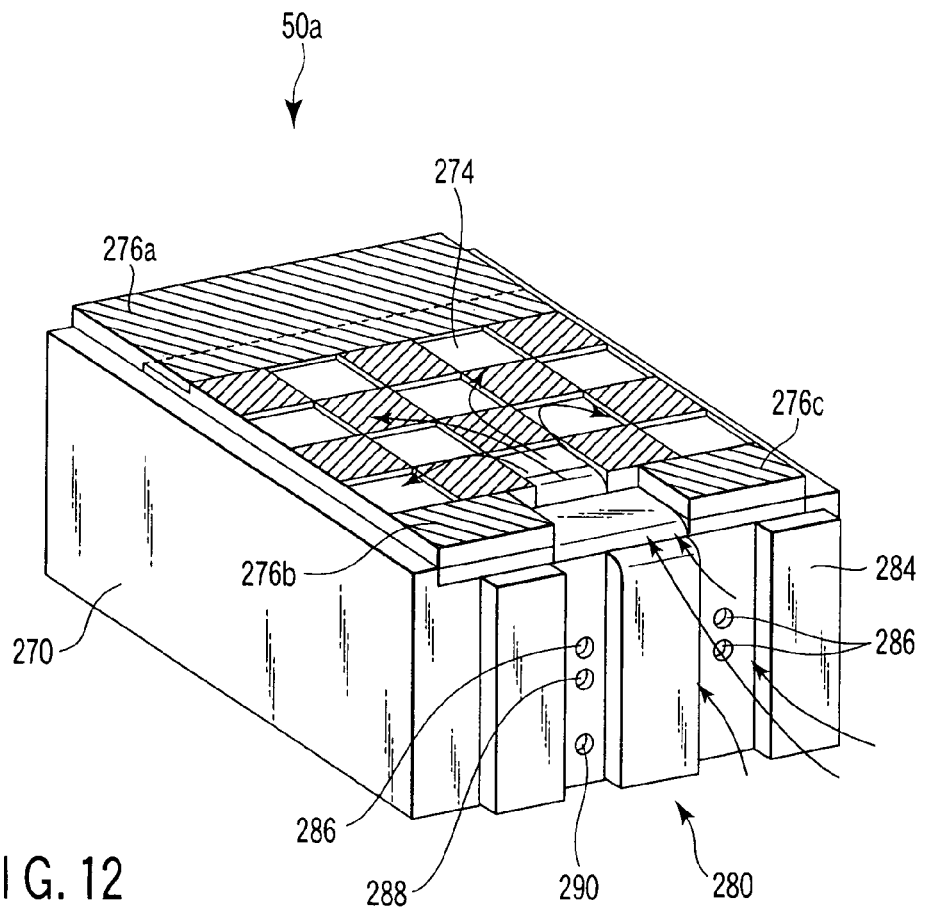
FIG. 12 is an appearance perspective view showing an example in which the fuel battery cell unit in FIG. 11 has been incorporated in a hydrogen storage alloy casing according to the second embodiment of the present invention.

FIGS. 10-12 show a structure of a second embodiment of the present invention, FIG. 10 is an appearance perspective view showing the structure of a fuel battery cell unit used in mobile terminal equipment, FIG. 11 is a sectional view showing a structure of a part of the fuel battery cell unit in FIG. 10, and FIG. 12 is an appearance perspective view showing an example in which the fuel battery cell unit in FIG. 11 has been incorporated in a hydrogen storage alloy casing.

In the embodiment described below, since basic configuration and operation of a fuel battery and mobile terminal equipment having a battery receiving chamber that receives a fuel battery according to the present invention are the same as those of first embodiment described above, same portions or parts are denoted by the same reference numbers in order to avoid duplication of explanation, their illustrations and explanation are omitted so that only different portions or parts are explained.

In FIG. 10, in a fuel battery cell unit 50a, a cathode provided with a plurality of vent holes 274 and covered with stainless steel is exposed to an upper face of a fuel battery 272. A main body of the fuel battery 272 is covered with a hydrogen storage alloy container 270. A plurality of protrusion sections 276a to 276c is provided on an upper face of the hydrogen storage alloy container 270. An opening section 282 (a portion which forms a space section when a fuel battery is inserted into a battery receiving chamber: see FIG. 2A) serving as an air inflow port 280 and allowing passage of air is provided between the protrusion section 276b and the protrusion section 276c of these protrusion sections. A portion positioned on a crossing line of the opening 282 and a protrusion of a cooling fin 284 is chamfered with a radius of about 0.3 to 1 mm. Edge portions of the protrusion section 276b and the protrusion section 276c are also chamfered.

A plurality of cooling fins 284 formed in rectangular undulation manner is provided on a front face of the battery cell 272. A plurality of air suction ports 286 and a hydrogen discharge port 288 are provided in recess sections of the cooling fins 284. A hydrogen replenishing port 290 is provided below the hydrogen discharging port 288.

With such a configuration, as shown in FIG. 1, when the fuel battery cell unit 50a is inserted into a battery receiving chamber 20, flow of air inserted from Moltpren of a battery lid (not shown) is drawn into the plurality of air inflow ports 280. Air flow passing through the opening 282 section is drawn into the plurality of vent holes 274. At this time, it is made possible to reduce spiral vortex formed by inflow air at an outlet of the opening by chamfering the protrusion sections 276a to 276c and the protrusion sections of the cooling fins 284 on the opening section 282.

In FIG. 11, the fuel battery cell unit 50a is provided with a solid polymer electrolytic film 294 made of a plate material with a thickness of, for example, about 75 to 100 μm, an anode plate 296, a first metal plate 298 made of a stainless steel plate with a thickness of about 0.5 to 1 mm, a cathode plate 302, and a second metal plate 304 made of magnetic material with a thickness of, for example, about 0.5 to 1 mm. A plurality of vent holes (air suction ports 306) formed by etching is formed in the second metal plate 304.

A magnet film layer 310 magnetized in a thickness direction is bonded to a space section of the solid polymer electrolytic film 294 disposed on the first metal plate 298. When permanent magnet material such as an alnico magnet, a ferrite magnet, a rare-earth magnet (for example, SmCo or the like) is used as the magnet film layer 310, its magnetic force is strong and its thickness can be made thin, but it is expensive. Accordingly, a ferrite bond magnet or a plastic bond magnet is used here. Since the bond magnet is inexpensive and it is not exposed to an outer face, it can be used without causing magnet damage.

A hydrogen injection port 300 is formed on the first metal plate 298 and a plurality of positioning pins 312 is provided thereon in a standing manner. The solid polymer electrolytic film 294, the anode plate 296, and the cathode plate 302 are stacked on the first metal plate 298, and bushes 314 made from insulating material are embedded into the second metal plate 304. The first metal plate 298 and the second metal plate 304 are coupled to each other by insertion of the bushes 314 of the second metal plate 304 into the positioning pins 312. Therefore, a structure where stacked layers of the solid polymer electrolytic film 294, the anode plate 296, and the cathode plate 302 are pressurized mutually is obtained.

An outer shape of the fuel battery cell unit 50a is formed in a rectangular shape by sealing both sides of the fuel battery cell unit 50a using sealing members 316 made of synthetic resin or rubber, and a plurality of protrusion sections 318 is formed on an upper face of the fuel battery cell unit 50a. Though the vicinity of protrusion sections 276b and 276c shown in FIG. 12 is here shown in FIG. 11, a symmetrical structure is adopted as described later, so that explanation about the vicinity of the protrusion section 276a is omitted.

As shown in FIG. 12, the fuel battery cell unit 50a is provided with a recess section formed on the upper face of the hydrogen storage container 270 and the fuel battery cell unit 50a is placed on the recess section and is bonded thereto using adhesive.

By forming the projection sections in the fuel battery cell unit 50a in this manner, assembling is made easy. By selecting an attracting force of a magnet film properly, pressurizing amounts among the stacked layers of the solid polymer electrolytic film 294, the anode plate 296, and the cathode plate 302 can be adjusted mutually so that, when the first metal plate 298 and the second metal plate 304 are unitized and fixed to each other, a pressurizing amount between both the plates does not change. The fuel battery cell unit 50a is inserted into the battery receiving chamber 20, and a fitting state with a gap (a looseness of 10 to 20 μm) is achieved so as not to cause change of a pressurizing amount due to contact between an inner surface of the battery receiving chamber 20 and the protrusion sections of the fuel battery cell unit 50*a*.

Figure 13:
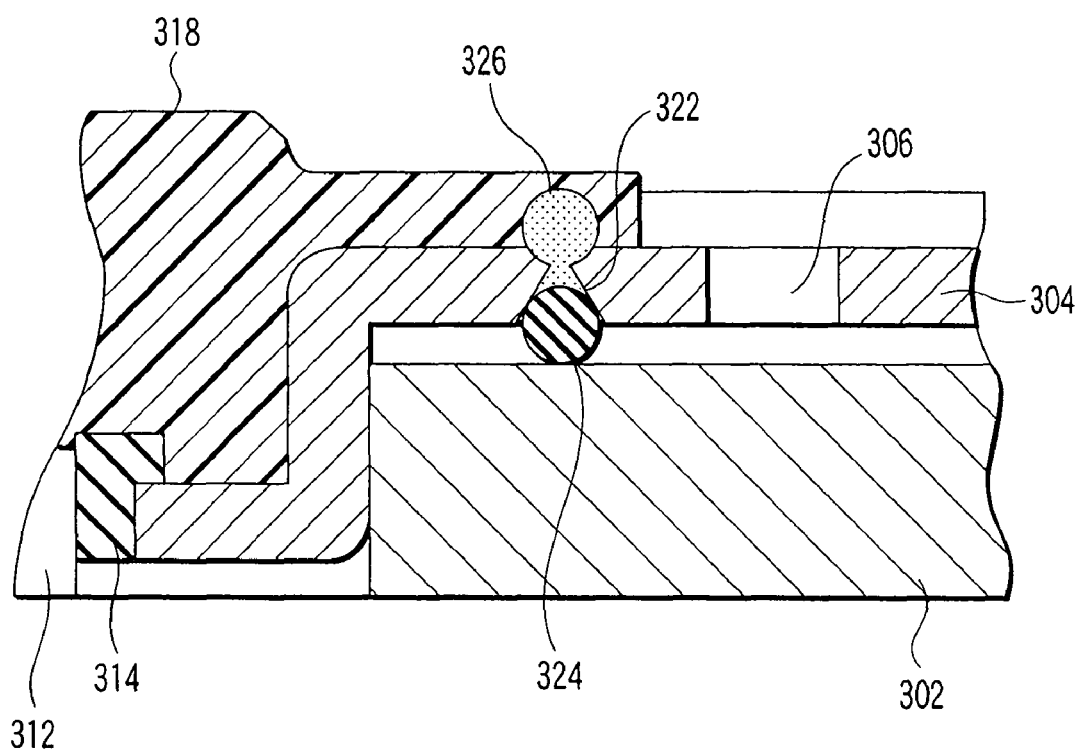
FIG. 13 is a sectional view showing a structure of a part of the fuel battery cell unit for explaining the vicinity of a protrusion section 276a in FIG. 12 according to a modification in FIG. 11.

The vicinity of protrusion section 276*a* shown in FIG. 12 will be explained as a modification of the embodiment shown in FIG. 11 with reference to FIG. 13.

A V-shaped groove 322 is provided on the second metal plate 304 and an O-shaped ring member 324 is fixed on the V-shaped groove 322 using ultraviolet cure adhesive 326. The O-shaped ring member 324 directly contacts with the cathode plate 302. The O-shaped ring member 324 is deformed in a rectangular shape on the second metal plate 304 to be arranged on a peripheral portion of the second metal plate 304. With such an arrangement, a structure that, when the first metal plate 298 and the second metal plate 304 are coupled to each other, the stacked layers of the solid polymer electrolytic film 294, the anode plate 296, and the cathode plate 302 are pressurized mutually by a pressing force of the O-shaped ring member 324. However, high precision working regarding flatness on a surface of the second metal plate 304 contacting with the cathode plate 302 can be skipped.

(Third Embodiment)

Now, Jpn. Pat. Appln. KOKAI Publication No. 2005-321490 discloses a camera where a fuel tank is disposed (fixed) at a lower portion of a camera main body from interior to exterior of a grip portion in FIG. 3 thereof. In the camera, when the fuel tank is empty, it is detached from a fuel supplying path and a fresh fuel tank filled with fuel is attached to the fuel supplying path. In FIG. 5, a generator cell, a fuel supplying unit, and the fuel tank are disposed in a grip unit. Power generated at the generator cell is supplied to respective electronic parts in the camera main body via fuel battery contacts provide in the grip unit.

However, since no protrusion section is provided on an outer face of the generator cell on the cathode side, an inner face of the camera main body facing a cathode, or on an outer face of the grip unit on the cathode side, an air passage for supplying external air cannot be assured.

A third embodiment of the present invention will be explained below.

Figure 14A:
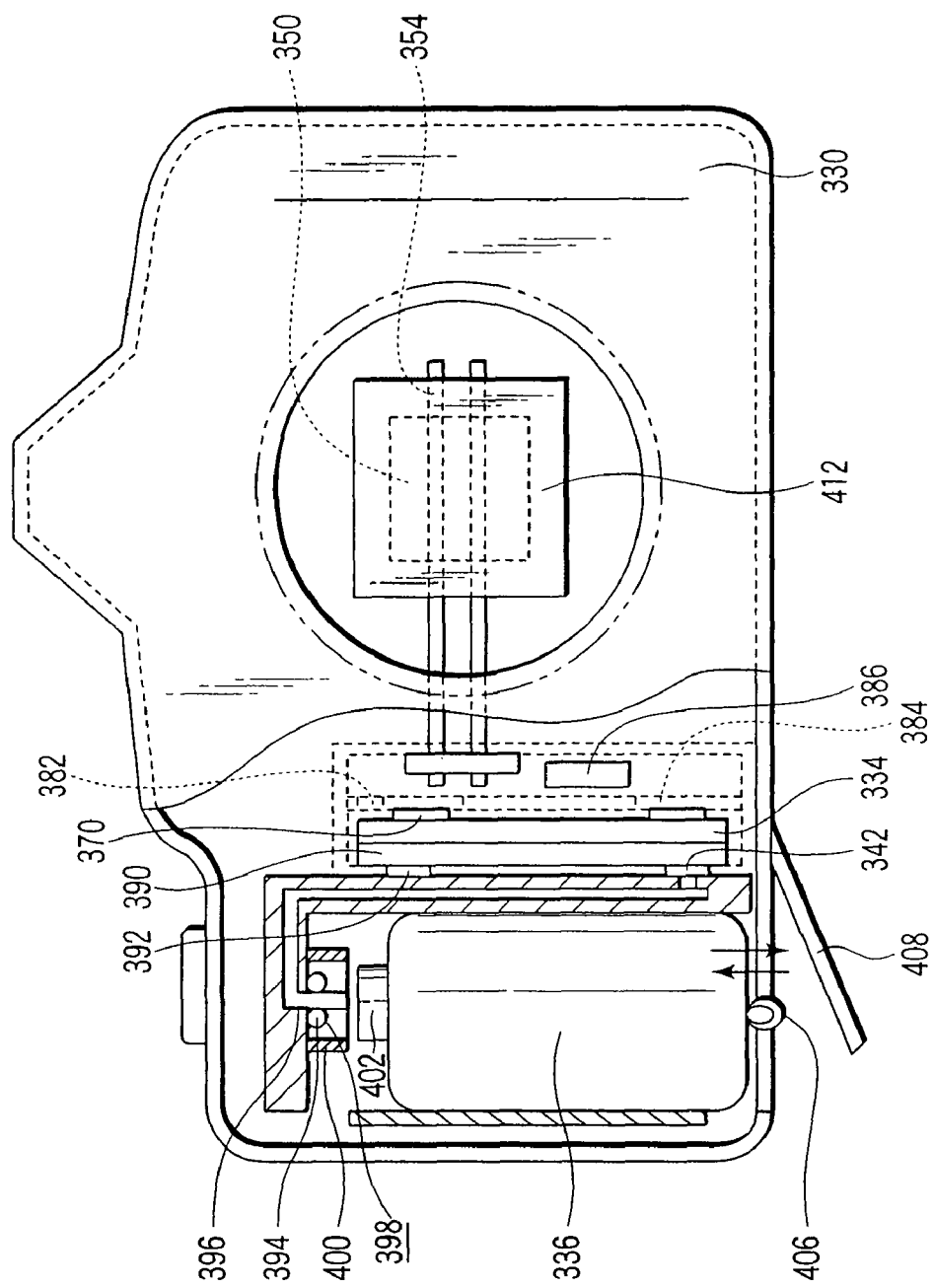

FIGS. 14A and 14B shows a schematic configuration of a single-lens reflex electronic camera with an interchangeable lens including an interchangeable lens mounting portion as mobile terminal-equipment according to a third embodiment of the present invention, FIG. 14A is a partially-cut front view of an electronic camera main body in a state in which an interchangeable lens has been removed, and FIG. 14B is a perspective view of the electronic camera main body in a state in which the interchangeable lens has been removed, viewed from above.

In FIGS. 14A and 14B, a grip section 332 for a user to grasp an electronic camera main body 330 is provided on a left side of the electronic camera main body 330. A battery receiving chamber 338 for receiving a fuel battery cell 334 and a fuel tank 336 is provided interior of the grip portion 332. An air intake port 340 and a connection pipe 342 are interposed on the anode side (oxygen electrode) of the fuel battery cell 334 within the battery receiving chamber 338.

A main frame 346 having a tripod screw section at a lower portion in the electronic camera and made of aluminum material with a high heat conductance or PPS resin charged with nodular graphite and carbon fibers is provided with an imaging device 350, an image device supporting plate 352 supporting the imaging device 350 via an insulating sheet 348, a fuel (fixed with a silicon substrate formed with a fuel battery cell 334, a pressure adjusting valve 390, and the like), and a battery receiving chamber 338 receiving an attachable and detachable fuel battery (hydrogen storage alloy) tank 336 which are disposed about an optical axis O of an imaging lens system (not shown).

A heat pipe® for heat absorption 354 described later is joined to a back face of the imaging device supporting plate 352. The heat pipe for heat absorption 354 is attached to a pipe placement section 356 provided on the main frame 346.

On the other hand, a printed board soldered with an analog front end (AFE) IC device or a control circuit (CPU) (not shown) is fixed to the main frame 346 behind the imaging device 350 using a small screw. A shield box 364 in which an LCD 360 and a backlight 362 constituting a liquid crystal display unit are received is fixed to the main frame 346 by a screw (not shown) or the like. The LCD 360 and an exterior cover 366 are fixed by a pressing plate (window frame) 368.

Protrusion sections 370 are provided on the cathode side (oxygen electrode) of the fuel battery. An air storage chamber 372 storing external air, an air intake port 340 connected to the air intake chamber 372 for taking in external air, and a breathable water-shedding sheet 374 with high water repellency joined in a boundary between the air intake port 340 and the air storage chamber 372 are provided opposite to the protrusion sections 370. The water-shedding sheet 374 allows passage of external air but it prevents water or dusts from entering in the air storage chamber 372.

The air storage chamber 372 is fixed to the main frame 346. A heat pipe® for heat radiation 378 and a pipe supporting stand (heat sink) 380 for supporting the heat pipe for heat radiation 378 described later are disposed in the air storage chamber 372. A fuel battery cell 334 is attached to the air storage chamber 372 via the protrusion sections 370. Incidentally, in FIG. 14A, reference number 382 denotes a first opening section, 384 denotes a second opening section, and 386 denotes an air intake port.

A silicon substrate, on which a pressure adjusting valve 390 and other elements are formed, is fixed to the fuel battery cell 334. The pressure adjusting valve 390 and the fuel battery cell 334 are connected, via a connection pipe 342, to a fuel supplying path 396 in a frame member 394 attached via a spacer 392.

A packing member 398 is disposed around the fuel supplying path 396, and a tank connection port 400 provided at an end portion of the fuel supplying path 396 is connected to a tank port 402, so that fuel is supplied from the fuel tank 336 to the fuel supplying path 396.

In FIG. 14A, a knob 406 is provided below the fuel tank 336. A lower lid 408 openably and closably provided below the grip portion 332 of the camera main body 330 is opened or closed so that the fuel tank 336 is made movable in a direction shown by arrow. Thereby, the fuel tank 336 can be taken from or loaded in the camera main body 330.

Incidentally, a quick return mirror 412 for guiding imaging beam entered from an interchangeable lens (not shown) into a finder optical system is provided in front of the imaging device 350 so as to be capable of advancing in and retracting from a photographing optical path. An interchangeable lens mount portion 414 for allowing attachment of an interchangeable lens is provided on the camera main body 330 in front of the quick return mirror 412.

An insulating sheet 348 with high heat conductance is joined to a face of the imaging device 350 positioned on the opposite side of a light receiving face thereof by adhesive so that the imaging device 350 is attached to the imaging device supporting plate 352. The insulating sheet 348 is directly joined with the heat pipe for heat absorption 354 with one or plural wicks with a circular, an oval, or a polygonal sectional shape formed on an inner wall thereof via synthetic resin plated on the imaging device supporting plate 352 with aluminum material or the same copper alloy as the heat pipe. Specifically, as shown in FIG. 15A, a metallic sheet obtained by performing surface treatment for absorbing radiation heat, for example, applying irregular undulation treatment or black alumite treatment to a surface of the aluminum material is adopted.

A plurality of (two in this case) recesses are formed on the imaging device supporting plate 352, and the heat pipe for heat absorption 354 is fixed in the recesses by adhesive or caulking so that the metal sheet material is joined to the imaging device supporting plate 352.

On the other hand, in a plurality of air storage chambers 372, a heat pipe for heat radiation 378 is fixed to an inner wall of the air storage chamber 372 via a heat sink 380 having heat radiating effect using a small screw (not shown), adhesive (not shown), or the like. The heat pipe for heat radiation 378 is formed on its inner wall with one or plural wicks with a circular, an oval, or a polygonal cross-sectional shape. Pure water, alcohol, or the like is here used as a working fluid.

The heat pipe for heat absorption 354 disposed perpendicularly to the optical axis O of the imaging lens and the heat pipe for heat radiation 378 disposed in parallel with the optical axis O of the imaging lens are connected to each other by a seamless metallic pipe provided on the main frame 346 and supported by the pipe placement stand 356. That is, the heat pipe for heat absorption 354 provided on the imaging device supporting plate 352 and the heat pipe for heat radiation 378 disposed in the air storage chamber 372 are connected to each other by a bellows-type connecting pipe 418 which can be accommodated. The bellows-type connecting pipe 418 has a structure deformable when the imaging device supporting plate 352 supporting the imaging device 350 is moved in a two-dimensional direction.

In FIG. 15A, the camera is provided with an electromagnetic driving mechanism (described later in detail) that can move the imaging device supporting plate 352 in a two-dimensional manner (a plane perpendicular to the optical axis O of the imaging lens [X and Y directions]). When image blurring on a light receiving face of the imaging device 350 is corrected, the heat pipe for heat absorption 354 is fixed to the imaging device supporting plate 352 in order to prevent temperature rise of the imaging device 350 driven at high speed. A lead terminal (not shown) of the imaging device 350 is connected to a flexible printed circuit (FPC) board 420 by soldering. A terminal of the FPC board 420 is connected to a printed board 422 by a connector (not shown).

The printed board 422 is formed integrally with a heat storage material 438 near the heat pipe for heat radiation 378 fixed to a lens unit 426 by a small screw 424. Further, a CPU 428 for performing power control on a fuel battery or a secondary battery provided on the electronic camera, strobe emission light control, display unit control, input operation unit control, system control, a timing generator (TG) IC chip for driving the imaging device 350 at a high speed or an analog front end (AFE) IC chip 430, and a pair of print coils for X-axis driving and for Y-axis driving are attached on the printed board 422. Each of the print coils 432 and 434 is further joined with a rectangular metal material 436 with a high surface hardness and a thickness of about 1 mm (for example, a steel material) which is a part of a guide bearing with retainer.

As described above, the electromagnetic driving mechanism is configured to include the printed board 422, the imaging device supporting plate 352 movably supported opposite to face the printed board 422, and the guide bearing 436 that is supporting means for supporting the imaging device supporting plate 352. Further, the square-shaped print coils for X-axis driving and for Y-axis driving 432 and 434 which are printed on the printed board 422 are disposed in the electromagnetic driving mechanism. Magnetic materials 440 are disposed so as to cross the respective print coils for driving and Hall elements 442 and 444 for X-axis detecting and for Y-axis detecting are embedded inside the respective print coils for driving 432 and 434. The respective Hall elements 442 and 444 are for detecting a position of the movable imaging device supporting plate 352.

Two permanent magnets magnetized in a thickness direction and joined such that opposite polarities face each other are disposed on the imaging device supporting plate 352. Magnetic pressing force (magnetic attracting force) acts on a guide bearing 436 with a retainer having at least four steel balls between at least one pair of first and second permanent magnets of the imaging device supporting plate 352 and the magnetic material 440 of the printed board 422. When the pressing force serves, the steel balls in the guide bearing 436 are pressed on the imaging device supporting plate 352 and the printed board 422. As a result, chattering of the steel balls interposed among the imaging device supporting plate 352 and the printed board 422 and the guide bearing 436 is removed.

The first permanent magnet (not shown) magnetized in a thickness direction and positioned so as to face the print coil for X-axis driving 432 disposed on the printed board 422 is polarized and magnetized such that N pole and S pole are arranged in an extending direction of the FPC board 420. The second permanent magnet (not shown) is polarized and magnetized such that N pole and S pole are arranged in a direction perpendicular to the extending direction of the FPC board 420.

On the other hand, the print coil for Y-axis driving 434 is formed in a horizontally long rectangular shape and it is disposed such that its long side faces each magnetic pole of the first permanent magnet. Similarly, the print coil for X-axis driving 432 is formed in a horizontally long rectangular shape and it is disposed such that its long side faces each magnetic pole of the second permanent magnet.

In the embodiment, the magnetic material 440 is disposed so as to cross the print coils for driving 432 and 434 and the Hall elements 442 and 444 are disposed inside the print coils for driving, and supporting means utilizing magnetic attracting force is constituted between the imaging device supporting plate 352 and the printed board 422 using the guide bearing 436 with a retainer. However, when a bearing is formed on the side of the imaging device supporting plate 352 and a guide shaft is provided on the side of printed board 422 without using the magnetic material 440 on the printed board 422, supporting means using a metal bearing and adopting a configuration that an intermediate member movable in a uniaxial direction is disposed between the imaging device supporting plate 352 and the printed board 422 and the imaging device supporting plate is moved in direction perpendicular to a moving direction of the intermediate member can be utilized.

Though a set of first and second permanent magnets is here utilized in the embodiment, such a configuration can be adopted that four permanent magnets are disposed such that the permanent magnets are positioned on diagonal lines, four print coils for driving are disposed to be positioned on the printed boards opposed to each other, and magnetic pieces are disposed on back face positions of the respective print coils for respective axis driving on extension lines of the print coils for X-axis driving and for Y-axis driving opposed to each other. Alternatively, the magnetic pieces may be arranged so as to be surrounded by the print coil for X-axis driving and for Y-axis driving.

In addition, the magnetic pieces are disposed such that the coils for driving and the first permanent magnet cross N pole and S pole and the magnets are disposed on the side of the imaging device supporting plate, but such a configuration can be adopted that the coils for driving and magnetic material are disposed on the side of the imaging device supporting plate and the magnet is disposed on the printed board.

Further, the FPC board 420 for transmitting an output signal from the imaging device 350 to the printed board 422 is connected between the imaging device supporting plate 352 and the printed board 422.

Next, the CPU 428 for performing position control of the imaging device supporting plate 352 supporting the imaging device 350 has a driving circuit disposed on the printed board 422. The CPU 428 controls the driving circuit for driving movement in X-axis direction which is the horizontal direction of the imaging device supporting plate 352 and movement in Y-axis direction which is the vertical direction of the imaging device supporting plate 352.

The CPU 428 performs control for moving the imaging device supporting plate 352 in a desired position based upon angular velocity inputted from gyro (not shown). When current is caused to flow in the print coil for Y-axis driving 434 in a vertical direction within magnetic flux of the permanent magnets disposed on the imaging device supporting plate 352 and joined in a heteropolar manner and the imaging device supporting plate 352 is moved, position detection is performed by a Hall element (not shown). When current flow to the print coil for Y-axis driving 434 is cut, the imaging device supporting plate 352 is returned back to an initial position due to magnetic balance between the magnet and the magnetic material.

Similarly, the CPU (control circuit, controller) 428 performs control for moving the imaging device supporting plate 352 to a desired position based upon angular velocity inputted from gyro (not shown). When current is caused to flow in the print coil for Y-axis driving 434 in a vertical direction within magnetic flux of the permanent magnets disposed on the imaging device supporting plate 352 and joined in a heteropolar manner and the imaging device supporting plate 352 is moved, position detection (not shown) is performed by a Hall element (not shown).

When current flow to the print coil for Y-axis driving 434 is cut, the imaging device supporting plate 352 is returned back to an initial position against bellows-type connecting pipe 418 due to magnetic balance between the magnet and the magnetic material.

Thus, when the lens unit vibrates, the imaging device 350 on the movable imaging device supporting plate 352 moves in a two-dimensional direction, and image blurring on the light receiving face of the imaging device 350 can be corrected.

With such a configuration, when a temperature of the imaging device 350 driven at a high speed rises, heat generated from the imaging device (heat source) 350 is transferred to the insulating sheet 348 and the imaging device supporting plate 352. Heat transfer at the imaging device supporting plate 352 and radiation and convection heat at the insulating sheet 348 are transferred to the heat pipe for heat absorption 354. Working fluid in the heat pipe for heat absorption 354 takes heat to evaporate, the vapor with increased pressure passes through the bellows-type connecting pipe 418, and the vapor flows to a lower pressure side of the air storage chamber 372 on the heat pipe for heat radiation 378 so that the vapor discharges heat to condensate. The condensed working fluid is again returned back to the heat pipe for heat absorption 354 by capillary pumping force of the wicks. Temperature rise of the imaging device 350 can be suppressed due to a cycle of the evaporation, condensation, and back-flow.

Incidentally, as shown in FIG. 15B, an S-shaped flexible cable 446 made from plastic synthetic resin may be connected between the heat pipe for heat absorption 354 and the heat pipe for heat radiation 378 instead of the above-mentioned bellows-type connection pipe 418.

Next, the above-mentioned heat pipe (registered Trademark) used as the heat radiating member in the present embodiment will be explained.

The heat pipe is constituted by enclosing and sealing a proper amount of working fluid in a pipe having a structure with capillary action called "wick" on an inner wall along the pipe in an axial direction (a longitudinal direction) thereof in a pressure reduction manner. When heat is applied to a heat absorption side of the heat pipe which is one end thereof, working fluid in the wick takes heat to evaporate and the vapor with increased pressure is returned back to a heat radiation side of the heat pipe which is the other end thereof. The cycle of evaporation→condensation → back-flow is performed extremely rapidly in this manner, so that an effect of heat removal from a member which has generated heat is obtained.

As described above, as the heat pipe in the embodiment, there are the heat pipe for heat absorption 354 disposed on the back face side of the imaging device 350 and the heat pipe for heat radiation 378 disposed inner section of the fuel battery receiving chamber or on the outer wall of the fuel battery receiving chamber.

FIGS. 16A and 16B show one configuration example of the heat pipe that is the heat radiating member, FIG. 16A being a sectional view of the heat pipe, taken along an axial direction of the heat pipe, and FIG. 16B being a sectional view of the heat pipe, taken along a direction perpendicular to the axial direction of the pipe.

Polyphenylene sulfide (PPS) resin 452 where granular graphite has been charged with glass fibers is formed in a pressure bonding manner on a metal wire 450 such as a copper wire connected between the heat pipe for heat absorption 354 and the heat pipe for heat radiation 378. Further, a coil spring 454 made of stainless steel material is wound on a recess section on an exterior portion of the PPS resin 452 and it is fixed thereon using adhesive with high heat conductance. Further, PPS resin formed with the radiation fins is formed in a pressure bonding manner on the heat radiation side.

With such a structure, the heat pipe for heat absorption 354 (here, a copper wire) receives heat and the heat is heat-transferred from the copper wire to the polyphenylene sulfide (PPS) resin 452 and the coil spring 454 on the heat radiation side to be radiated in a space section or a clearance inside the camera. Accordingly, a temperature rise of the imaging device 350 due to high-speed driving can be suppressed. Heat conductance can be increased due to charging of graphite with high heat conductance.

FIGS. 17A and 17B shows another configuration example of the heat radiating member, FIG. 17A being an appearance view showing heat sink for a heat absorption, and FIG. 17B being a sectional view showing a portion of the heat sink for heat absorption in an enlarged manner.

As another example of the heat radiating member, there is a heat sink for heat absorption formed on a heat pipe for heat absorption. The heat sink for heat absorption has two different heat radiation fin structures, which have an approximately same area. For example, as shown in FIG. 17A, a heat sink for heat absorption 460 on one distal end of the heat pipe for heat absorption has a small outer shape and a thickness thereof in an axial direction thereof is made thick. On the other hand, a heat sink for heat radiation 462 has a large outer size and a thickness thereof in the axial direction is made thin.

The heat pipe for heat radiation has a structure that several sheets of circular thin plates (metal such as aluminum material) are connected and coupled by several thin wires 464. A copper pipe 458 penetrates the several sheets of thin plates. In order to improve heat radiating effect, the thin wires are used.

By forming the heat sink for heat absorption in this manner, heat transfer from the heat pipe for heat absorption receiving heat from the imaging device driven at high speed to the heat sink for heat absorption takes place so that heat can be radiated into a space section or a clearance inside the camera. Further, the heat radiating effect is improved in addition to heat transfer from the copper pipe 458 to the heat sink for heat radiation 462.

Figure 18:
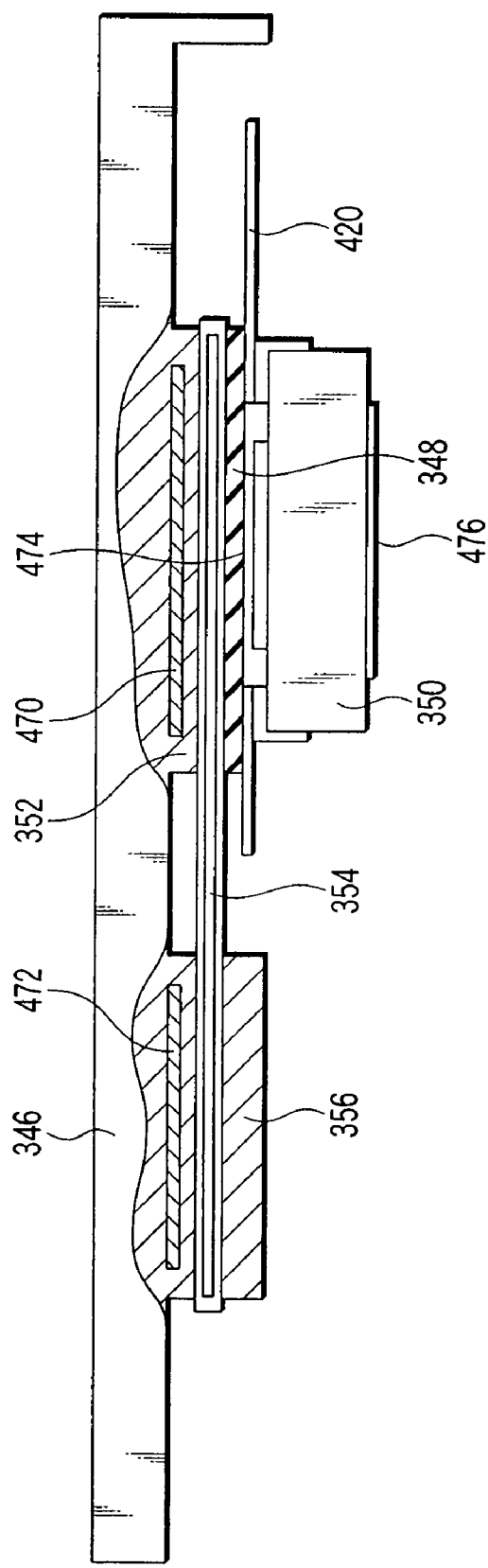
FIG. 18 is a view for explaining a further modification of the heat radiating member shown in FIGS. 16A and 16B.

Another modification of the heat radiating member shown in FIGS. 16A and 16B and described above will be explained with reference to FIG. 18.

Heat storage material is insert-molded integrally with any section of the main frame 346, the pipe placement section 356, the imaging device supporting plate 352, and the battery receiving chamber 338. The main frame 346 or the battery receiving chamber 338 used here is made from synthetic resin such as ABS resin or polycarbonate (PC) resin charged with oxidized metal or carbon fiber. In order to elevate heat conductance to heat storage material (for example, paraffin) 470 and 472, it is most preferable that polyphenylene sulfide (PPS) resin charged with nodular graphite and carbon or glass fiber, or the like is used.

The heat storage materials 470 and 472 are made from organic paraffin or wax, or inorganic hydrated salt whose phase change (change from solid to liquid or change from liquid to solid) occurs at an equipment operating temperature or less. At this time, rod-shaped or rectangular heat storage materials 470 and 472 made from metal with a low melting point are disposed on the battery receiving chamber 338, the pipe placement section 356 of the main frame 346, and the imaging device supporting plate 352 near the heat pipe 354. Alternatively, mixed material of the synthetic resin material and the heat storage material can be used. When organic heat storage material (for example, paraffin) is used, it is possible to blend gel agent in the organic heat storage material in order to reduce fluidity. Incidentally, in FIG. 18, reference number 474 denotes a heat conductive rubber, and 476 denotes a protective glass.

Heat generated by the imaging device 350 is transferred to the imaging device supporting plate 352 and the heat pipe 354. The transferred heat in the imaging device supporting plate 352 is temporarily absorbed in the heat storage material 470 (for example, phase-change material having a melting point of about 60 to 80° C.: solid melts to liquid) near the imaging device supporting plate 352 to be radiated from the main frame 346 or the battery receiving chamber 338 to the outside through the vent holes. Further, the transferred heat in the pipe placement section 356 is temporarily absorbed in the heat storage material 472 (phase-change material having a melting point of about 60 to 80° C.: solid melts to liquid) to be radiated from the main frame 346 or the battery receiving chamber 338 to the outside through the vent holes.

Incidentally, the latent heat storage material used here is configured as a heat storage microcapsule obtained by covering organic heat storage material or inorganic heat storage material with core material or a container, where a fixed temperature is maintained by melting and solidification of the heat storage material storable at a temperature of 60 to 80° C. Accordingly, rapid rise of a temperature of the fuel battery cell or the imaging device can be suppressed.

Next, a modification of the single-lens-reflex type electronic camera according to the third embodiment will be explained with reference to FIG. 19.

In such an electronic camera as shown in FIGS. 14A and 14B, the heat pipe for heat radiation is provided inside the air storage chamber, but such a configuration is adopted in the modification that the heat pipe for heat radiation is provided outside the air storage chamber.

The air storage chamber is configured as a first air supplying chamber 480, and a second air supplying chamber and hydrogen discharging chamber 482 are formed subsequently to the first air supplying chamber 480. A first opening section 484 is formed in the first air supplying chamber 480 and a second opening section 486 is formed in the second air supplying chamber and hydrogen discharging chamber 482.

Further, the heat pipe for heat absorption 354 is fixed to the main frame 346 via a thermally-conductive rubber 490, and the heat pipe for heart radiation 378 is similarly fixed to an outer wall of the first air supplying chamber 480 via a thermally-conductive rubber 492. Incidentally, in FIG. 19, reference number 494 denotes a guide member for loading the fuel tank 336 in the battery receiving chamber to fix the same.

With such a configuration, temperature rise of the imaging device 350 driven at a high speed can be suppressed.

When a temperature near the loaded fuel tank (hydrogen storage alloy container) or a temperature near the imaging device reaches a desired temperature (for example, 60° C. which is a fuel battery operation limiting temperature or higher) within the battery receiving chamber, the control circuit in the electronic camera stops power supplying from the fuel battery to an automatic focusing operation, imaging or playing operation, performs switching to charging operation to the secondary battery, and stops all operations after a predetermined time elapses.

The embodiments of the present invention have been explained above, but the present invention is not limited to the embodiments described above and it may be implemented in a variously-modified manner without departing from the gist of the present invention. For example, such a configuration has been adopted that the glass substrate and the silicon substrate which is a semiconductor substrate are joined to each other, but such a configuration can be adopted that the glass substrate is replaced by a semiconductor substrate and both the semiconductor substrates are joined to each other.

Inventions in various stages are included in the above-mentioned embodiments, so that various inventions can be extracted according to proper combinations of the disclosed plural constituent elements. For example, even if some constituent elements are removed from all the constituent elements shown in the embodiments, when the problem described in BRIEF SUMMARY OF THE INVENTION can be solved and the effect therein can be achieved, an invention where the some constituent elements have been removed can be extracted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. Mobile terminal equipment which uses a fuel battery, including a battery receiving chamber to be loaded with a fuel battery comprising a hydrogen storage alloy container, a control valve, and a fuel battery cell, comprising:

an insertion hole provided in the battery receiving chamber and through which the fuel battery is inserted and removed;

a lid which closes the insertion hole and has a plurality of vent holes;

at least two guide faces provided on an upper surface of the battery receiving chamber and spaced apart from each other, and which face the insertion hole; and protrusion sections which are provided on a surface of the fuel battery cell where a plurality of vent holes are arranged and which respectively face the guide faces when the fuel battery is stored in the battery receiving chamber, wherein a first space portion is formed between the guide faces and spatially communicates with the insertion hole and a second space portion formed above the surface between the protrusion sections, and wherein when the fuel battery is stored in the receiving chamber, the first space portion and the second space portion are connected, and air is supplied from the vent holes of the lid to the vent holes of the fuel battery cell through the first space portion and the second space portion.

2. The mobile terminal equipment according to claim 1, wherein a terminal assembly is provided on a side face of the fuel battery, and a first power source terminal of the fuel battery cell, a second power source terminal which drives an opening and closing valve and the control valve, a terminal for a signal used for the control valve are provided on the terminal assembly.

3. The mobile terminal equipment according to claim 2, wherein the first and second power source terminals and the terminals for a signal are provided on a printed board disposed in the battery receiving chamber.

4. The mobile terminal equipment according to claim 3, wherein the first power source terminal and the second power source terminal are disposed on the printed board separately from each other.

5. The mobile terminal equipment according to claim 1, comprising a plurality of contact points in the terminal assembly disposed at a side face position on an outer surface of the fuel battery, wherein the contact points are connected to the first and second power source terminals when the battery receiving chamber is loaded with the fuel battery.

6. The mobile terminal equipment according to claim 1, wherein a battery receiving guide face including two faces which are parallel to each other on the same face is provided on an inner surface of the battery receiving chamber, and when the battery receiving chamber is loaded with the fuel battery, a space section is provided between the fuel battery cell and the inner surface of the battery receiving chamber.

7. The mobile terminal equipment according to claim 1, wherein a notch for preventing wrong insertion is formed on an outer surface of the fuel battery.

8. The mobile terminal equipment according to claim 1, wherein an opening is provided between an air vent hole for taking external air into the equipment and the fuel battery cell, and the protrusion section provided on the fuel battery cell is disposed at a position opposite to the opening.

9. The mobile terminal equipment according to claim 8, wherein the mobile terminal equipment is an electronic camera, a heat pipe for heat absorption is fixed on an imaging device which receives an image formed by an imaging lens and an imaging device supporting member which supports the imaging device, and a heat pipe for heat radiation is fixed in the vent hole.

10. The mobile terminal equipment according to claim 9, wherein the heat pipe for heat radiation is disposed near an oxygen electrode of the fuel battery cell, and an equipment main body supporting the heat pipe for heat radiation is provided with a cooling apparatus in which a latent heat storage material of phase change material is disposed.

11. The mobile terminal equipment according to claim 1, comprising a container casing that holds the hydrogen storage alloy container, the control valve, and the fuel battery cell, wherein the container casing comprises a first container casing holding the hydrogen storage alloy container and the control valve and a second container casing holding the fuel battery cell, and a heat insulating material or a heat storage material is interposed between the first container casing and the second container casing.

* * * * *